US008681027B2

(12) United States Patent
Abe et al.

(10) Patent No.: US 8,681,027 B2
(45) Date of Patent: Mar. 25, 2014

(54) DIGITAL RECEIVER AND OPTICAL COMMUNICATION SYSTEM THAT USES SAME

(75) Inventors: Junichi Abe, Tokyo (JP); Hidemi Noguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/521,917

(22) PCT Filed: Feb. 24, 2011

(86) PCT No.: PCT/JP2011/054821
§ 371 (c)(1),
(2), (4) Date: Jul. 12, 2012

(87) PCT Pub. No.: WO2011/114891
PCT Pub. Date: Sep. 22, 2011

(65) Prior Publication Data
US 2012/0280844 A1   Nov. 8, 2012

(30) Foreign Application Priority Data
Mar. 16, 2010 (JP) .................. 2010-058686
Oct. 5, 2010 (JP) .................. 2010-225668

(51) Int. Cl.
*H03M 1/10* (2006.01)
(52) U.S. Cl.
USPC ........... 341/120; 341/118; 341/121; 341/142; 341/155
(58) Field of Classification Search
USPC ............... 341/118, 120, 139, 140, 155
See application file for complete search history.

(56) References Cited

U.S. PATENT DOCUMENTS

| 6,229,467 B1 * | 5/2001 | Eklund et al. ................. 341/120 |
| 6,411,235 B1 * | 6/2002 | Gurusami et al. ............. 341/139 |
| 6,618,436 B2 * | 9/2003 | Greiss et al. .................. 375/229 |
| 6,798,370 B1 | 9/2004 | Nagano |

(Continued)

FOREIGN PATENT DOCUMENTS

| JP | 6276098 A | 9/1994 |
| JP | 9219643 A | 8/1997 |

(Continued)

OTHER PUBLICATIONS

Savory, Seb J., "Digital filters for coherent optical receivers", Optics Express, Jan. 21, 2008, pp. 804-817, vol. 16, No. 2.

(Continued)

*Primary Examiner* — Linh Nguyen
(74) *Attorney, Agent, or Firm* — Sughrue Mion, PLLC

(57) ABSTRACT

A digital receiver includes: an analog-to-digital (AD) converter (102) for setting discrimination levels in accordance with a discrimination level control signal and converting an analog input signal into a digital signal based on the set discrimination levels; a discrimination level adjusting circuit (104) for generating the discrimination level control signal and outputting the discrimination level control signal to the AD converter; a signal quality monitoring portion (108) for generating a transfer function correction control signal, which is information about a transfer function of the AD converter; and a transfer function correcting circuit (106) for performing signal processing on the digital signal so as to cancel a gap between the transfer function of the AD converter and an initial transfer function based on the transfer function correction control signal.

11 Claims, 19 Drawing Sheets

(56) References Cited

U.S. PATENT DOCUMENTS

| | | | |
|---|---|---|---|
| 6,877,117 B1* | 4/2005 | Childers et al. | 714/704 |
| 6,980,140 B1* | 12/2005 | Rowland et al. | 341/118 |
| 7,106,231 B2* | 9/2006 | Smith et al. | 341/120 |
| 7,262,724 B2* | 8/2007 | Hughes et al. | 341/139 |
| 7,492,292 B2* | 2/2009 | Mezer et al. | 341/118 |
| 7,671,778 B2* | 3/2010 | Zhang et al. | 341/170 |
| 7,750,837 B2* | 7/2010 | Wang et al. | 341/172 |
| 2004/0091273 A1* | 5/2004 | Brissette et al. | 398/175 |
| 2004/0207550 A1 | 10/2004 | Nagano | |
| 2008/0100485 A1* | 5/2008 | Tanaka et al. | 341/141 |
| 2008/0198051 A1 | 8/2008 | Tanimura et al. | |
| 2008/0272943 A1* | 11/2008 | Tanimura et al. | 341/131 |

FOREIGN PATENT DOCUMENTS

| | | |
|---|---|---|
| JP | 2003101411 A | 4/2003 |
| JP | 2006-174073 A | 6/2006 |
| JP | 2008-205654 A | 9/2008 |

OTHER PUBLICATIONS

Schvan, Peter, et al., "A24GS/s 6b ADC in 90nm CMOS", ISSCC Digest of Technical Papers, Session 30, Data-Converter Techniques, IEEE International Solid-State Circuits Conference, Feb. 2008, pp. 544, 545 and 634, No. 30.3.

International Search Report of PCT/JP2011/054821, dated Apr. 19, 2011.

Office Action, dated Jan. 9, 2013, issued by the Japanese Patent Office in counterpart Japanese Application No. 2012-505602.

Office Action dated Oct. 23, 2013, issued by the Japanese Patent Office in corresponding Japanese Application No. 2013-12228.

* cited by examiner

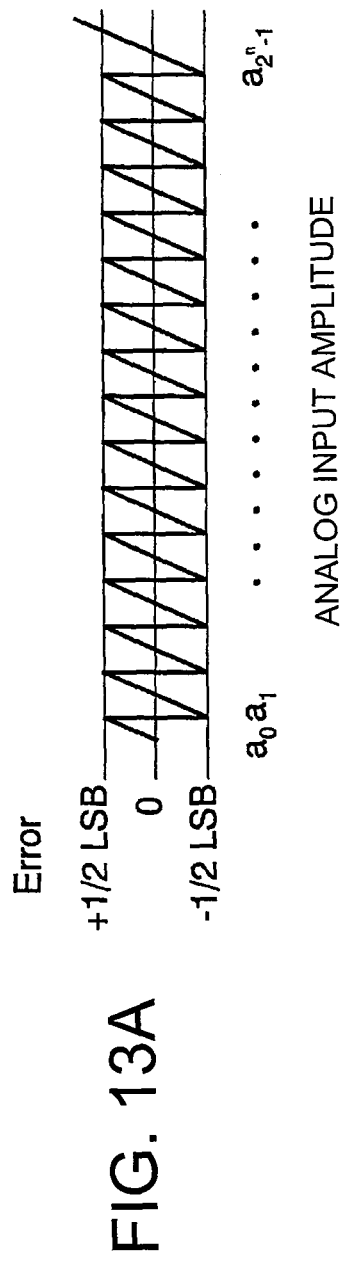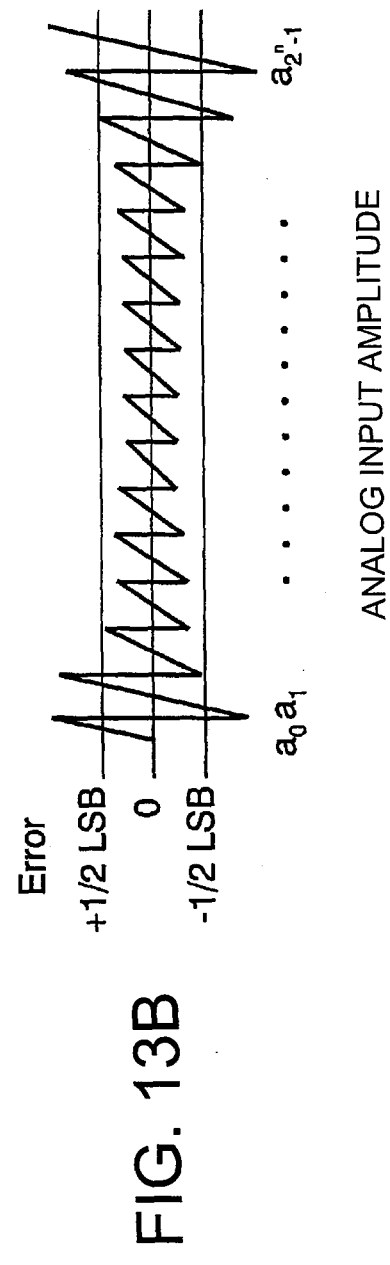

DIGITAL RECEIVER AND OPTICAL COMMUNICATION SYSTEM THAT USES SAME

CROSS REFERENCE TO RELATED APPLICATIONS

This application is a National Stage of International Application No. PCT/JP2011/054821 filed Feb. 24, 2011, claiming priority based on Japanese Patent Application Nos. 2010-058686 filed Mar. 16, 2010, and 2010-225668 filed Oct. 5, 2010, the contents of all of which are incorporated herein by reference in their entirety.

TECHNICAL FIELD

This invention relates to a digital receiver and an optical communication system that uses the digital receiver, and more particularly, to a digital receiver that employs digital coherent reception method and an optical communication system that uses the digital receiver.

BACKGROUND ART

In recent years, the importance of the digital coherent optical communication technology is increasing as the demand for faster networks with larger capacity grows. This communication method, also called intradyne reception, realizes a receiving sensitivity improved by 3 to 6 dB or more from On-Off Keying (OOK), Differential Quadrature Phase Shift Keying (DPSK), and other modulation methods that are widely used in conventional large-capacity optical communication systems. Other advantages of this method include the compatibility with polarization multiplexing method and multi-level modulation method such as Quadrature Amplitude Modulation (QAM).

FIG. 17 is a block diagram illustrating an example of a related digital coherent reception device (see Patent Literature 1 or Non Patent Literature 1, for example). Used as an input optical signal is a 4-channel (Ix, Qx, Ty, Qy) multiplexed signal which utilizes a polarization multiplexing (or Dual Polarization (DP))-Quadrature Phase Shift Keying (QPSK) signal. The input optical signal of each of the channels is separately converted into an analog electric signal by an optical-to-electrical (OE) converter and then into a digital signal by an analog-to-digital (AD) converter (ADC) that performs sampling in synchronization with a reference sampling clock (CLK).

Conventional (non-digital) coherent reception methods are not capable of stable reception due to a frequency/phase offset and polarization fluctuations of local oscillator (LO) light. However, the recent advance in the development of electronic devices has made high-speed AD converters available for use, and a frequency/phase offset, which has been a problem in conventional coherent reception methods, can now be compensated, as well as polarization fluctuations, by performing digital signal processing (DSP) on a signal that has been converted into a digital signal. As a result, stable, high-precision coherent reception is achieved. In digital coherent reception, wavelength dispersion compensation and more sophisticated waveform equalization technologies can be performed in addition to the frequency/phase offset compensation and polarized wave fluctuation compensation described above.

In an AD converter (see Non Patent Literature 2, for example) used in the related digital coherent reception device, intervals of discrimination levels are disposed as equally as possible by calibration or the like. The AD converter can thus have linear transfer characteristics as those illustrated in FIG. 18, and accomplish AD conversion that is higher in resolution (ENOB: effective number of bits) and low in distortion.

Patent Literature 1: Japanese Unexamined Patent Application Publication (JP-A) No. 2008-205654

Non Patent Literature 1: Seb J. Savory, "Digital filters for coherent optical receivers", Opt. Express, Vol. 16, No. 2, 804-817, 2008

Non Patent Literature 2: Peter Schvan, "A 24 GS/s 6b ADC in 90 nm CMOS", ISSCC Dig. Tech. Papers, pp. 544-634, February 2008

DISCLOSURE OF THE INVENTION

Ultra-high-speed AD converters in which the sampling rate exceeds several tens GSps, however, are affected greatly by characteristics fluctuations among elements that constitute the AD converters. Coupled with limitations to circuit speed and power consumption, this makes it difficult in the related AD converter to exert high-precision control for maintaining equally spaced discrimination levels, and is a reason that balancing high resolution and high speed is not easy. Nevertheless, multi-level modulation method and Orthogonal Frequency-Division Multiplexing (OFDM) modulation method are expected to be employed in the next-generation optical communication systems which exceed 100 Gbps, and a further increase in resolution and speed is demanded of AD converters.

An AD converter that lacks in resolution makes waveform distortion compensation by DSP unsatisfactory particularly when the optical signal-to-noise ratio (SNR) is low, when a high degree of dispersion is applied, when multi-level modulation is used, or the like, and deteriorates system performance.

This invention seek to improve the effective resolution of an AD converter by adjusting discrimination levels of the AD converter suitably according to the quality of a reception signal, and thus provide a digital receiver that meets the demand for higher resolution and higher speed.

A digital receiver according to an embodiment of this invention includes: analog-to-digital conversion means for setting discrimination levels in accordance with a discrimination level control signal, converting an analog input signal into a digital signal based on the set discrimination levels, and outputting the digital signal; discrimination level adjusting means for generating the discrimination level control signal and outputting the discrimination level control signal to the analog-to-digital conversion means; transfer function information generating means for generating information about a transfer function of the analog-to-digital conversion means which is dependent on the discrimination levels; and transfer function correcting means for performing signal processing on the digital signal so as to cancel a gap between the transfer function of the analog-to-digital conversion means and an initial transfer function, which is set in advance, based on the information about the transfer function.

According to an aspect of this invention, a discrimination level used for analog-to-digital conversion is controlled and a gap between a transfer function of an analog-to-digital converter which is dependent on the discrimination level and an initial transfer function is cancelled, to thereby improve the effective resolution of the analog-to-digital converter and prevent a physical lack of resolution of the analog-to-digital converter from deteriorating the reception precision of a digital receiver.

BRIEF DESCRIPTION OF THE DRAWING

FIG. 2 shows diagrams illustrating discrimination level spacing set to an AD converter that is included in the digital receiver of FIG. 1, in which FIG. 2(a) shows eye patterns of a signal relatively high in SNR, FIG. 2(b) is a histogram showing the signal level distribution thereof, FIG. 2(c) is a diagram illustrating discrimination level spacing that is set to an AD converter when linear transfer characteristics which are ideal in a related digital receiver are to be realized, and FIG. 2(d) is a diagram illustrating discrimination level spacing that is set to the AD converter of the digital receiver of FIG. 1 when an input signal is relatively high in SNR.

FIG. 3 shows diagrams illustrating discrimination level spacing set to the AD converter that is included in the digital receiver of FIG. 1, in which FIG. 3(a) shows eye patterns of a signal relatively low in SNR, FIG. 3(b) is a histogram showing the signal level distribution thereof, FIG. 3(c) is a diagram illustrating discrimination level spacing that is set to an AD converter when linear transfer characteristics which are ideal in the related digital receiver are to be realized, and FIG. 3(d) is a diagram illustrating discrimination level spacing that is set to the AD converter of the digital receiver of FIG. 1 when an input signal is relatively low in SNR.

FIG. 5 shows diagrams illustrating discrimination level spacing set to an AD converter that is included in the digital receiver of FIG. 4, in which FIG. 5(a) is a waveform diagram of an optical reception signal that has been affected by wavelength dispersion in a transmission path, FIG. 5(b) is a histogram showing the signal level distribution thereof, and FIG. 5(c) is a diagram illustrating discrimination level spacing that is set to the AD converter of the digital receiver of FIG. 4.

FIG. 10 shows diagrams illustrating an example of a signal that is input to the digital receiver according to the fourth embodiment of this invention, in which FIG. 10(a) is a waveform diagram and FIG. 10(b) is a histogram of the amplitude distribution of the waveform.

FIG. 13A is a graph showing quantization error characteristics of an AD converter on which the discrimination level mapping of FIG. 12 has been performed.

FIG. 13B is a graph showing quantization error characteristics of an AD converter on which the discrimination level mapping of FIG. 11 has been performed.

FIG. 17 shows diagrams illustrating an example of an optical reception signal, in which FIG. 17(a) is a waveform diagram of an optical reception signal that is received in the case where a CS-RZ modulation signal is affected by wavelength dispersion in a transmission path, and FIG. 17(b) is a histogram showing the signal level distribution thereof.

BEST MODE FOR EMBODYING THE INVENTION

Embodiments of this invention are described in detail below with reference to the drawings.

Figure 1:
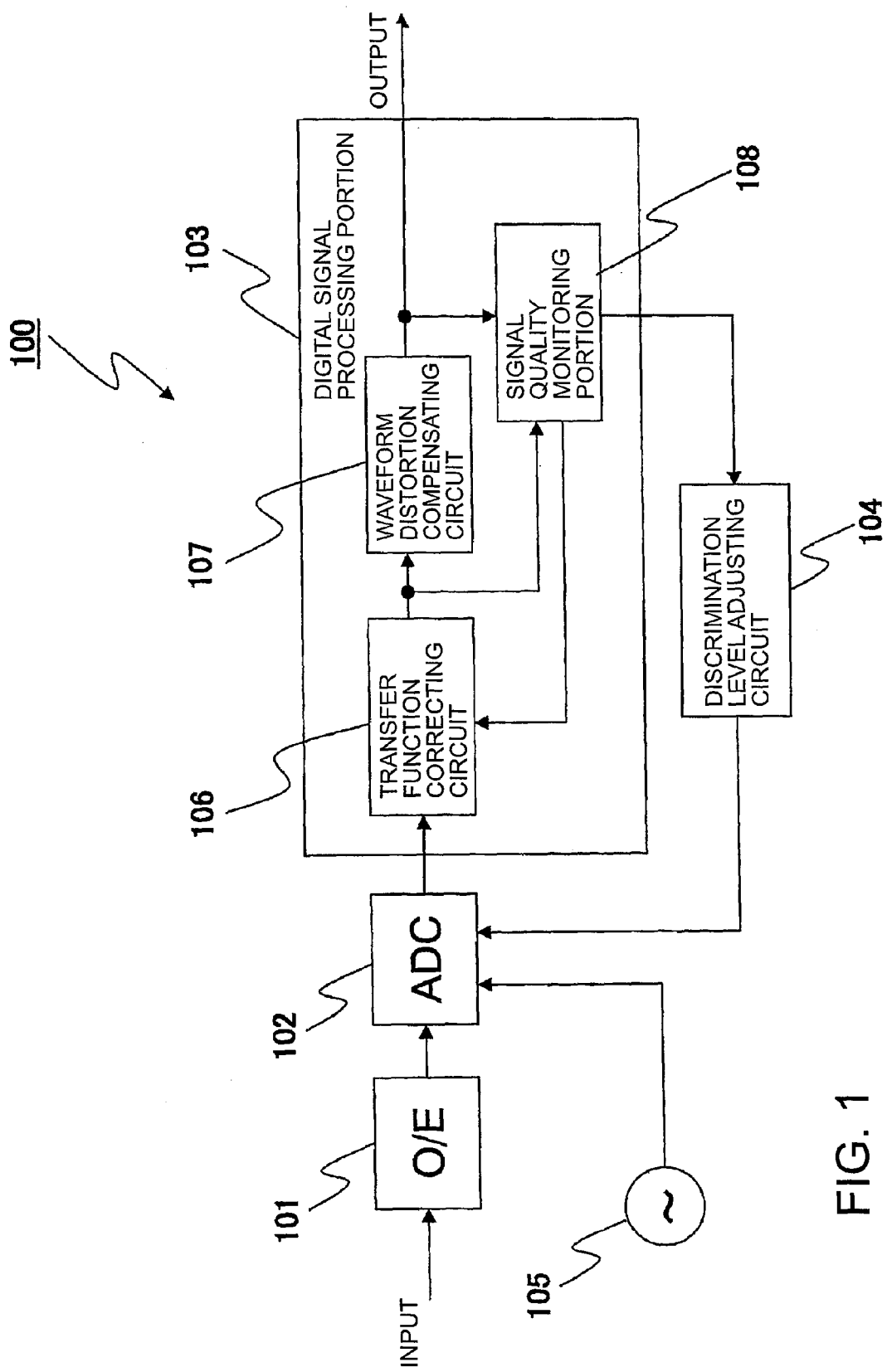
FIG. 1 is a block diagram illustrating the schematic configuration of a digital receiver according to a first embodiment of this invention.

FIG. 1 illustrates the schematic configuration of a digital receiver according to a first embodiment of this invention. The illustrated digital receiver 100, includes an optical-to-electrical (OE) converter 101, an analog-to-digital (AD) converter (ADC) 102, a digital signal processing portion 103, a discrimination level adjusting circuit 104, and an AD converter discrimination clock 105.

The optical-to-electrical converter 101 converts an optical input signal into an analog electrical signal.

The AD converter 102 converts an analog electrical signal (analog input signal) into a digital signal. The AD converter 102 also sets a plurality of discrimination levels used as a criterion in AD conversion in accordance with a discrimination level control signal from the discrimination level adjusting circuit 104. The AD converter 102 thus functions as analog-to-digital conversion means for setting discrimination levels in accordance with the discrimination level control signal, converting an analog input signal into a digital signal based on the set discrimination levels, and outputting the digital signal.

The digital signal processing portion 103 includes a transfer function correcting circuit 106, a waveform distortion compensating circuit 107, and a signal quality monitoring portion 108.

The transfer function correcting circuit 106 performs signal processing on a digital signal so as to correct the transfer characteristics of the AD converter 102. Specifically, the transfer function correcting circuit 106 performs signal processing on a digital signal so as to cancel a gap of the transfer function of the AD converter 102 from an initial transfer function. The transfer function of the AD converter 102 is dependent on set discrimination levels. This signal processing is performed accordingly based on a transfer function correction control signal from the signal quality monitoring portion 108. In other words, the transfer function correcting circuit 106 functions as transfer function correcting means for performing signal processing on a digital signal so as to cancel a gap between the transfer function of the analog-to-digital conversion means and a preset initial transfer function in accordance with a transfer function correction control signal.

The waveform distortion compensating circuit 107 performs signal processing on a digital signal so as to remove (compensates) distortion applied to an optical input signal along a transmission path.

The signal quality monitoring portion 108 monitors the quality of a digital signal. In FIG. 1, outputs from the transfer function correcting circuit 106 and the waveform distortion compensating circuit 107 both are input to the signal quality monitoring portion 108. The signal quality monitoring portion 108 may instead be configured to monitor signal quality by receiving an output from one of the transfer function correcting circuit 106 and the waveform distortion compensating circuit 107. The signal quality monitoring portion 108 outputs a monitoring result to the discrimination level adjusting circuit 104, and generates a transfer function correction control signal based on the monitoring result to output the transfer function correction control signal to the transfer function correcting circuit 106. The signal quality monitoring portion 108 thus functions as signal quality monitoring means for monitoring the quality of a digital signal, outputting a monitoring result, and generating a transfer function correction control signal based on the monitoring result.

The quality of a digital signal is influenced by the transfer function of the AD converter 102. A monitoring result therefore includes information about the transfer function of the AD converter 102. As information about the transfer function of the AD converter 102, the signal quality monitoring portion 108 generates a transfer function correction control signal and outputs the transfer function correction control signal to the transfer function correcting circuit 106. The signal quality monitoring portion 108 thus also functions as transfer function information generating means for generating information about the transfer function of the AD converter 102.

The digital signal processing portion 103, which includes the transfer function correcting circuit 106, the waveform distortion compensating circuit 107, and the signal quality monitoring portion 108, functions as digital signal processing means for performing signal processing on a digital signal and monitoring digital signal quality to output a monitoring result.

The discrimination level adjusting circuit 104 generates a discrimination level control signal for controlling the discrimination levels of the AD converter 102, based on monitoring information (a monitoring result) from the signal quality monitoring portion 108. In other words, the discrimination level adjusting circuit 104 functions as discrimination level adjusting means for generating the discrimination level control signal based on a monitoring result and outputting the discrimination level control signal to the analog-to-digital conversion means. The AD converter 102 sets (changes) the discrimination levels in accordance with the discrimination level control signal from the discrimination level adjusting circuit 104. Discrimination levels of the AD converter 102 are, for example, set to be spaced equally in an initial state and then changed in accordance with the discrimination level control signal to be spaced unequally.

The operation of the digital receiver 100 of FIG. 1 is described next.

An optical signal transmitted from an optical transmitter (not shown) is input via a transmission path (not shown) to the digital receiver 100. The optical-to-electrical converter 101 converts the input optical signal into an analog electrical signal. The AD converter 102 samples analog electrical signals in synchronization with clock signals from the AD converter discrimination clock 105 to convert the analog electrical signals into digital signals. A digital signal obtained by the conversion undergoes digital signal processing that includes transfer characteristics correction by the transfer function correcting circuit 106 and waveform equalization by the waveform distortion compensating circuit 107, and is subsequently output as an output signal.

Figure 19:
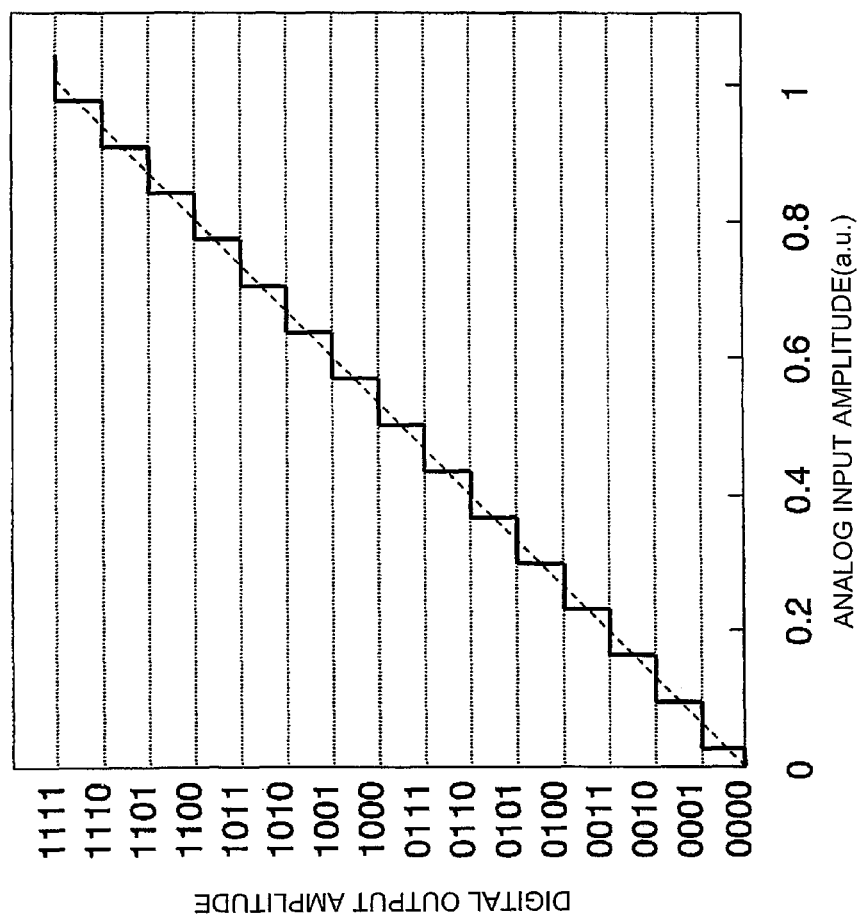
FIG. 19 is a graph showing ideal transfer characteristics that are demanded of an AD converter used in the digital coherent receiver of FIG. 18.

The AD converter of the related digital receiver uses, as described with reference to FIG. 19, equally spaced discrimination levels to discriminate and convert an analog signal into a digital signal. The AD converter 102 according to this embodiment, on the other hand, performs discrimination by adjusting (changing/setting) the discrimination levels in accordance with the discrimination level control signal from the discrimination level adjusting circuit 104. The transfer characteristics of the AD converter 102 consequently deviate from linear transfer characteristics, which are ideal in the related AD converter. The transfer function correcting circuit 106 performs signal processing so as to eliminate a gap generated by this deviation. The discrimination levels of the AD converter 102 are based on the monitoring result from the signal quality monitoring portion 108. Therefore, the transfer function correcting circuit 106 is controlled with a transfer function correction control signal, which is likewise based on a monitoring result, so as to cancel a transfer characteristics gap generated in the AD converter 102. In short, the transfer function correcting circuit 106 is given transfer characteristics that have inverse characteristics with respect to the gap. As a result, linear transfer characteristics are realized by the combination of the AD converter 102 and the transfer function correcting circuit 106.

The operation of the AD converter 102 and the discrimination level adjusting circuit 104 is described next in detail.

The AD converter 102 is improved in effective resolution by spacing discrimination levels unequally so as to yield high resolution in a domain where the signal density is high or where a signal change is rapid, and that yields the opposite result, namely, low resolution in a domain where the signal density is low or where a signal change is slow. The discrimination level adjusting circuit 104 generates a discrimination level control signal for adjusting discrimination levels of the AD converter 102 optimally based on monitoring information from the signal quality monitoring portion 108.

Figure 2:
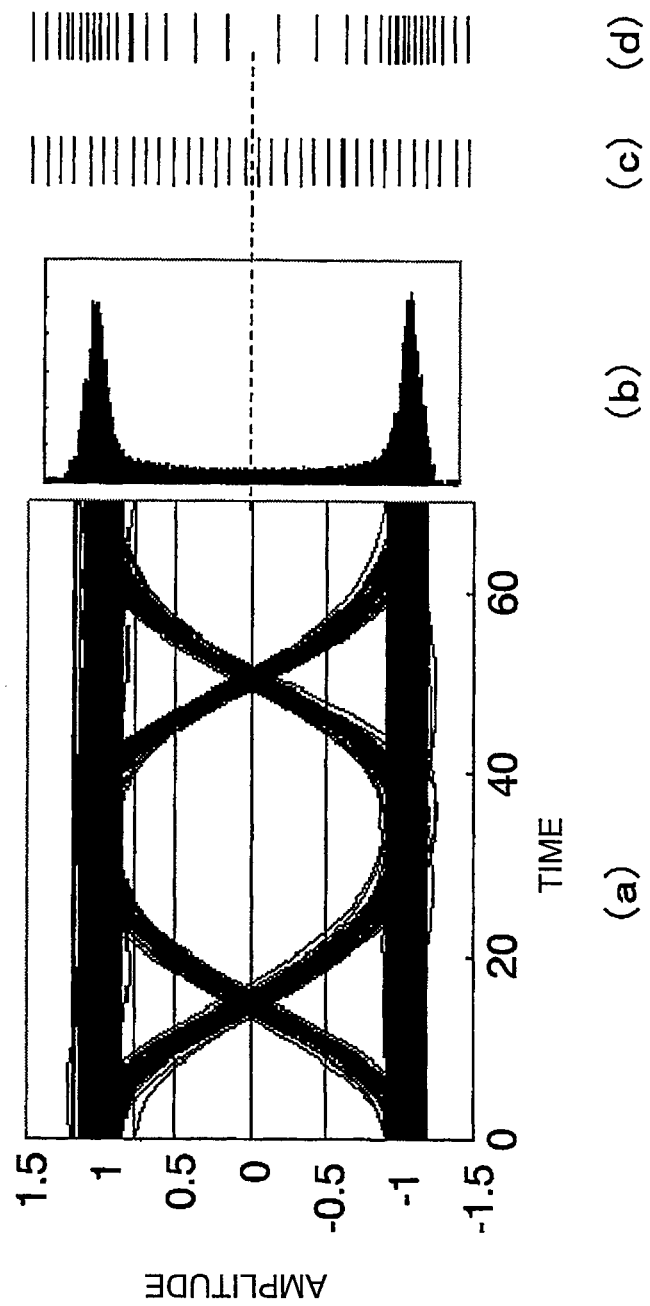
Figure 3:
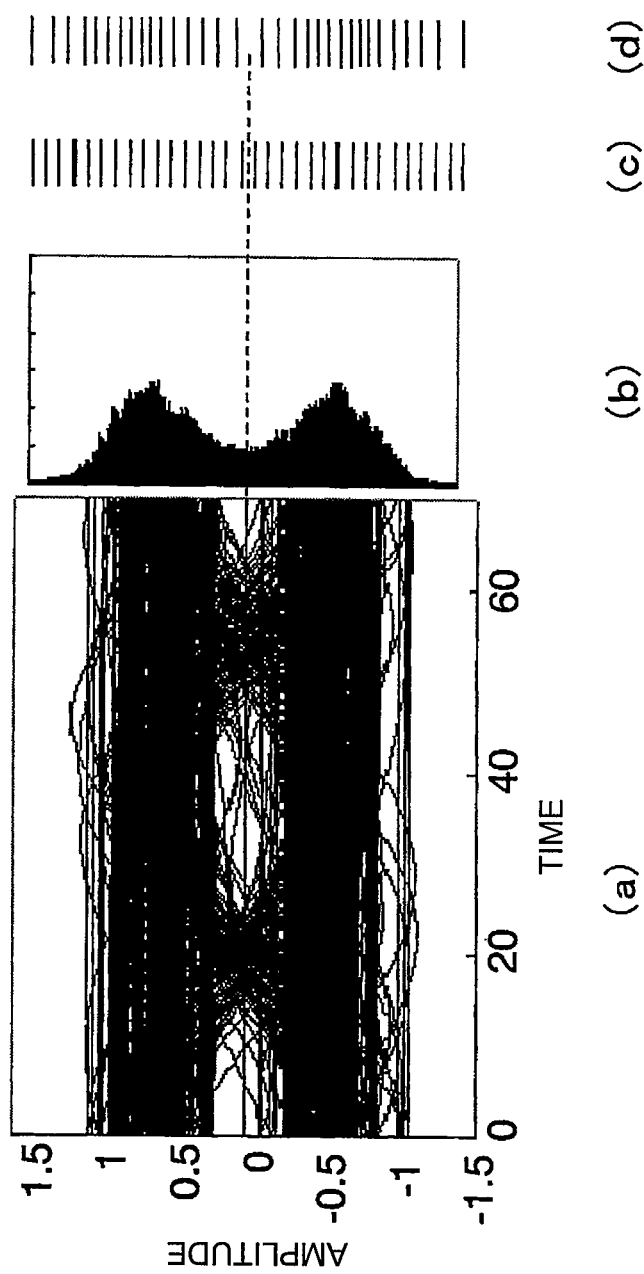

FIGS. 2 and 3 are diagrams illustrating discrimination levels of the AD converter 102 which are determined depending on whether the signal quality is high or low. The signal quality employed here is a signal to noise ratio (SNR). Depending on whether the SNR is high or low, eye openings or a signal level histogram changes as illustrated in FIGS. 2(a) and 2(b) and FIGS. 3(a) and 3(b). The signal quality monitoring portion 108 monitors the eye openings, the signal level histogram, or the like and obtains sparsity/density information of the level distribution or gradient information to determine discrimination levels of the AD converter 102.

FIG. 2(a) shows eye patterns observed when the SNR is relatively high. FIG. 2(b) shows a histogram of the signal level thereof. FIG. 2(c) illustrates discrimination levels of the related AD converter which are determined so as to give the AD converter linear transfer characteristics. FIG. 2(d) illustrates discrimination levels of the AD converter 102 which are determined based on the result of monitoring the eye patterns of FIG. 2(a) or the histogram of FIG. 2(b).

FIG. 3(a) shows eye patterns observed when the SNR is relatively low. FIG. 3(b) shows a histogram of the signal level thereof. FIG. 3(c) illustrates discrimination levels of the related AD converter which are determined so as to give the AD converter linear transfer characteristics. FIG. 3(d) illustrates discrimination levels of the AD converter 102 which are determined based on the result of monitoring the eye patterns of FIG. 3(a) or the histogram of FIG. 3(b).

As understood from FIGS. 2(b) and 2(d) and FIGS. 3(b) and 3(d), discrimination levels of the AD converter 102 are spaced unequally to minor the sparsity/density of the signal level distribution. The discrimination levels determined as illustrated in FIG. 2(d) or FIG. 3(d) are transmitted to the AD converter 102 by way of a discrimination level control signal, and are also reflected on a transfer function correction control signal.

The digital receiver 100 according to this embodiment can thus improve the effective resolution of the AD converter 102 by adjusting discrimination levels of the AD converter 102 so as to be optimum for the reception state. As a result, the reception precision of the digital receiver 100 is prevented from deteriorating even if the AD converter 102 physically lacks a resolution necessary for a waveform distortion compensation in the waveform distortion compensating circuit 107 when the optical SNR is low, when a high degree of dispersion is applied, when multi-level modulation is used, or the like.

Signal quality monitoring by the signal quality monitoring portion 108 is conducted constantly or periodically, to thereby adjust discrimination levels of the AD converter 102 adaptively to fluctuations in the transmission quality of the transmission path, and exert feedback control for maintaining a favorable reception state all the time.

While the digital receiver 100 according to this embodiment has points of monitoring by the signal quality monitoring portion 108 in front of and behind the waveform distortion compensating circuit 107, the monitoring points do not always need to be in front of and behind the waveform distortion compensating circuit 107, and can be placed anywhere depending on the signal type and the type of feed-forward/feedback control method.

A digital receiver according to a second embodiment of this invention is described next.

Figure 4:
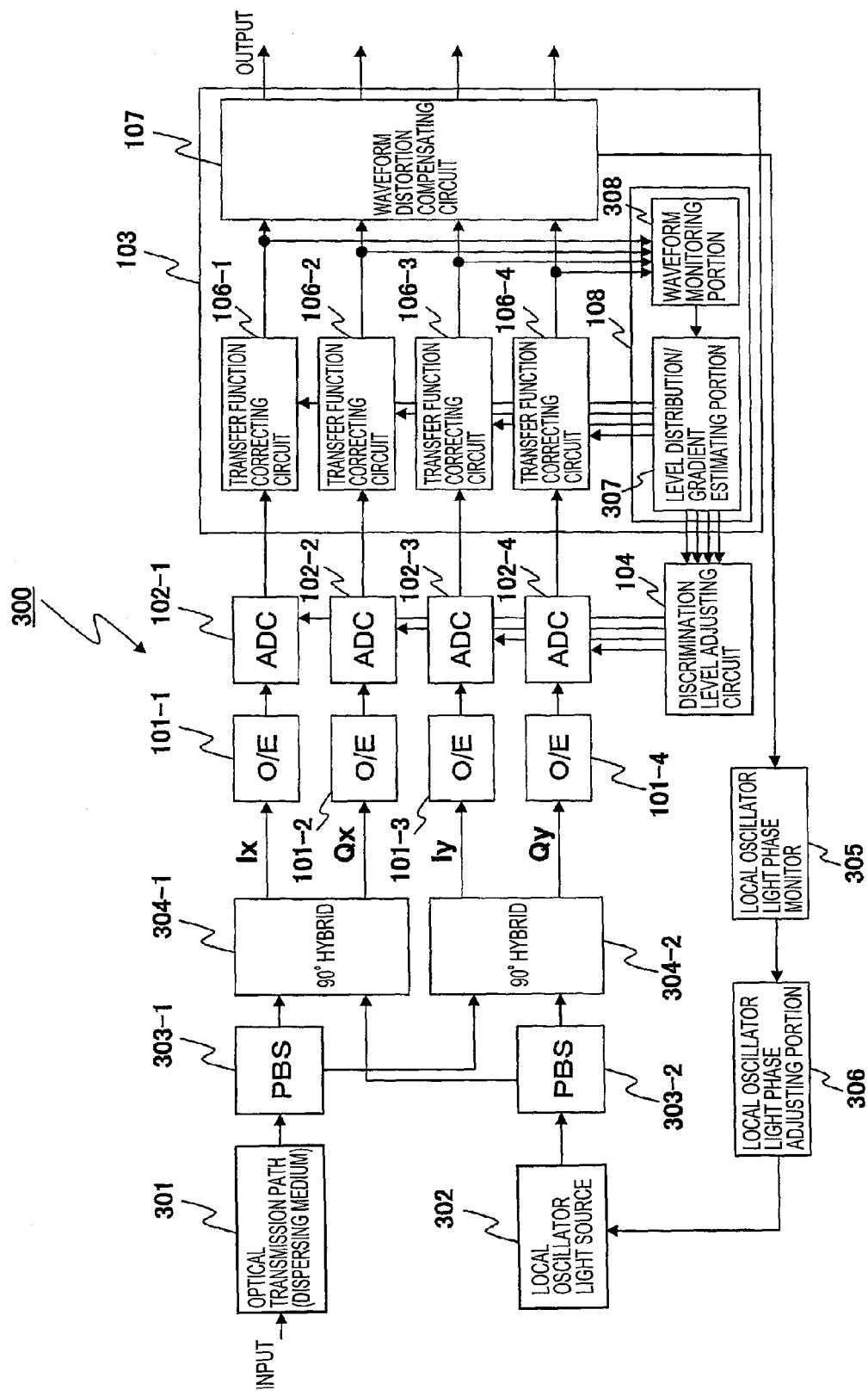
FIG. 4 is a block diagram illustrating the schematic configuration of a digital receiver according to a second embodiment of this invention.

FIG. 4 is a block diagram illustrating the schematic configuration of the digital receiver according to this embodiment. Components that are the same as those of the digital receiver of FIG. 1 are denoted by the same symbols in order to omit descriptions thereof.

The digital receiver of FIG. 4 which is denoted by 300 uses a Dual Polarization (DP)-QPSK signal as an input signal. The input signal is given to the digital receiver 300 via an optical transmission path 301, which is a dispersing medium.

The digital receiver 300 includes, as illustrated, a local oscillator light source 302, a pair of polarization beam splitters (PBSs) 303-1 and 303-2, a pair of 90°-hybrids 304-1 and 304-2, a local oscillator light phase monitor 305, and a local oscillator light phase adjusting portion 306.

The digital receiver 300 also includes four optical-to-electrical converters 101-1 to 101-4, four analog-to-digital converters 102-1 to 102-4, and four transfer function correcting circuits 106-1 to 106-4, which correspond to four signal channels.

Furthermore, the signal quality monitoring portion 108 of the digital receiver 300 includes a level distribution/gradient estimating portion 307 and a waveform monitoring portion 308.

The operation of the digital receiver 300 according to this embodiment is described next.

A DP-QPSK optical signal transmitted from an optical transmitter (not shown) is input to the digital receiver 300 via the optical transmission path 301. The optical transmission path 301 is, for example, an optical fiber and causes wavelength dispersion in an optical signal. In other words, a DP-QPSK optical signal input to the digital receiver 300 has waveform distortion resulting from wavelength dispersion in the optical transmission path 301.

The DP-QPSK optical signal input to the digital receiver 300 is split by the PBS 303-1 into two polarized components and supplied to the 90°-hybrids 304-1 and 304-2.

Local oscillator light from the local oscillator light source 302 is split into two by the PBS 303-2 and supplied to the 90°-hybrids 304-1 and 304-2.

The 90°-hybrids 304-1 and 304-2 split/combine signals from the PBS 303-1 and from the PBS 303-2 separately, to demodulate the signals into optical signals Ix, Qx, Ty, and Qy, which correspond to two channels for each PBS, four channels in total. The four optical signals Ix, Qx, Ty, and Qy obtained by demodulation are input to the optical-to-electrical converters 101-1 to 101-4, respectively.

The optical-to-electrical converters 101-1 to 101-4 respectively convert the input optical signals Ix, Qx, Ty, and Qy into analog electrical signals and output the analog electrical signals obtained by the conversion to the AD converters 102-1 to 102-4.

The AD converters 102-1 to 102-4 respectively convert the input analog electrical signals into digital signals and output the digital signals obtained by the conversion to the transfer function correcting circuits 106-1 to 106-4.

The transfer function correcting circuits 106-1 to 106-4 perform signal processing on the input digital signals so as to correct the transfer characteristics of the AD converters 102-1 to 102-4, as in the first embodiment.

Thereafter, the digital signals of the respective channels are input to the waveform distortion compensating circuit 107. The waveform distortion compensating circuit 107 outputs, to the outside, signals processed by digital signal processing such as clock extraction, retiming, wavelength dispersion compensation, polarization tracking, and local oscillator light phase estimation. The digital signal processing in the waveform distortion compensating circuit 107 is described in detail in, for example, Non Patent Literature 1.

The result of the local oscillator light phase estimation performed in the waveform distortion compensating circuit 107 is monitored by the local oscillator light phase monitor 305 and the result of the monitoring is given to the local oscillator light phase adjusting portion 306. Based on the monitoring result from the local oscillator light phase monitor 305, the local oscillator light phase adjusting portion 306 controls the local oscillator light source 302 so as to maintain an appropriate phase (oscillation frequency) of local oscillator light. The local oscillator phase adjusting portion 306 controls the phase of local oscillator light by controlling the drive current and temperature of a semiconductor laser (LD) that is used in the local oscillator light source 302.

The digital receiver 300 according to this embodiment includes the waveform monitoring portion 308 in the signal quality monitoring portion 108. The waveform monitoring portion 308 is realized by, for example, a waveform monitoring circuit that uses exclusive OR (XOR) and a histogram monitoring circuit that uses counters (accumulators) respectively corresponding to levels.

Figure 5:
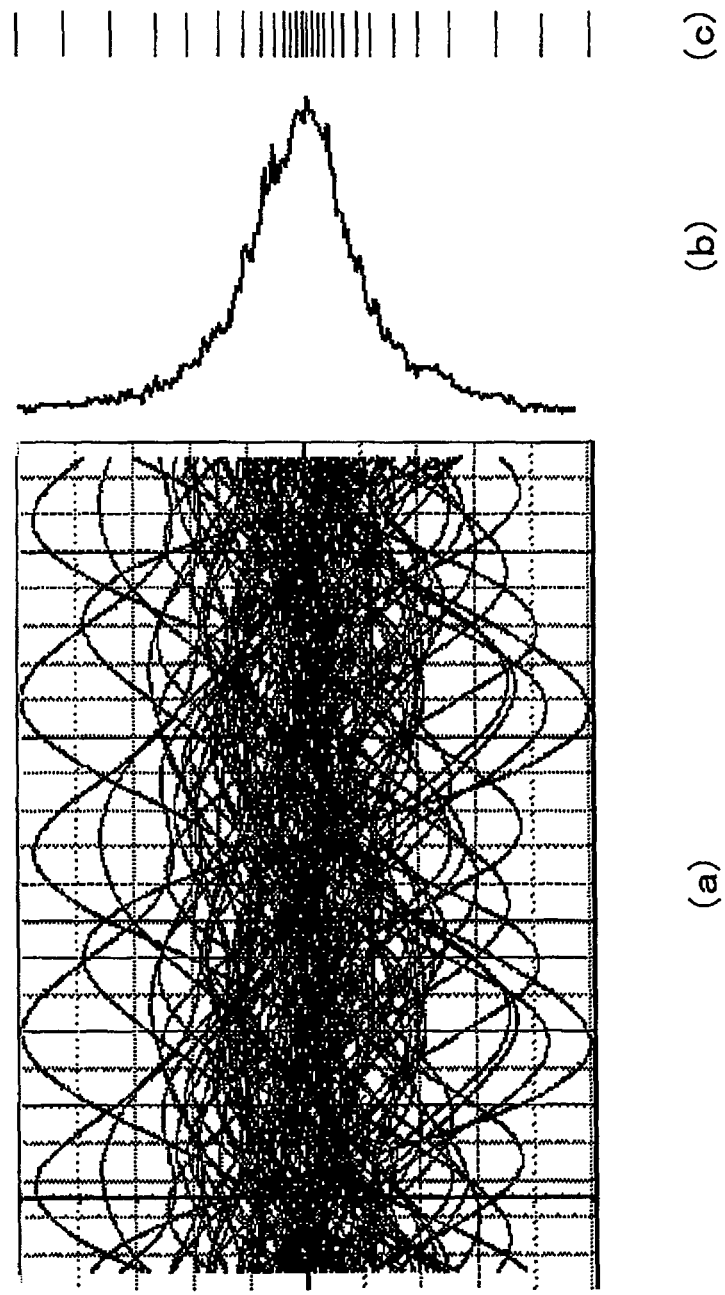

FIG. 5(a) is a diagram showing an example of the waveform of an optical input signal that travels through the optical transmission path 301 (wavelength dispersion: 10,000 psec/nm) and is then input to the digital receiver 300. The waveform monitoring portion 308 monitors (observes) such signal waveform as this and outputs the result of the monitoring.

Based on the monitoring result from the waveform monitoring portion 308, the level distribution/gradient estimating portion 307 obtains such reception level histogram distribution f(x) as the one shown in FIG. 5(b), or obtains the absolute value of the gradient of f(x) which is expressed as g(x)=|df(x)/dx|. The histogram distribution f(x) or the absolute value g(x) of the gradient thereof is obtained for each channel.

The level distribution/gradient estimating portion 307 supplies the obtained f(x) or g(x) to the discrimination level adjusting circuit 104. The discrimination level adjusting circuit 104 generates, for the respective channels, discrimination level control signals for adjusting discrimination levels of the AD converters 102-1 to 102-4 so that the discrimination levels are spaced in inverse proportion to f(x) or g(x) as illustrated in FIG. 5(c).

The level distribution/gradient estimating portion 307 further generates transfer function correction control signals based on the obtained f(x) or g(x), and outputs the transfer function correction control signals to the transfer function correcting circuits 106-1 to 106-4. The transfer function correcting circuits 106-1 to 106-4 realize transfer characteristics that have inverse characteristics with respect to gaps from ideal linear transfer characteristics which have been generated in the AD converters 102-1 to 102-4. In short, linear transfer characteristics are obtained by the combination of the AD converters 102-1 to 102-4 and the transfer function correcting circuits 106-1 to 106-4.

Which of f(x) and g(x) is to be used for the discrimination level adjustment can be determined arbitrarily based on the characteristics of the input signal or the like. Alternatively, f(x) and g(x) may be used in combination. A combining method such as weighted addition or multiplication can be employed in this case. In either case, an optimum method suited to the state of the input signal can be selected.

Figure 6B:
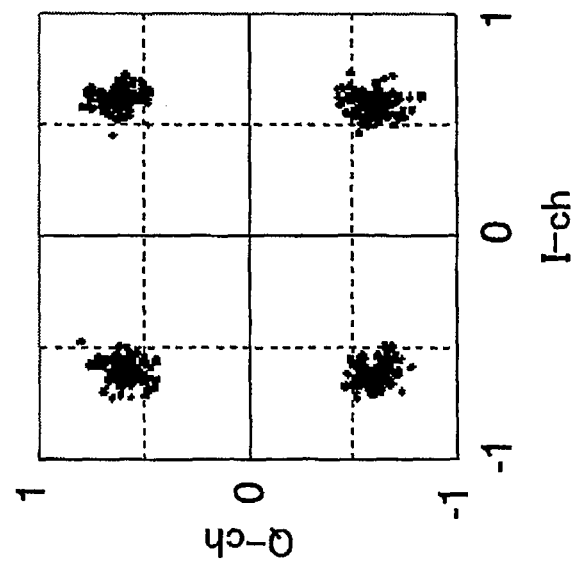
FIG. 6B is a diagram illustrating a signal constellation that is observed when the phase tracking has been performed.
Figure 6A:
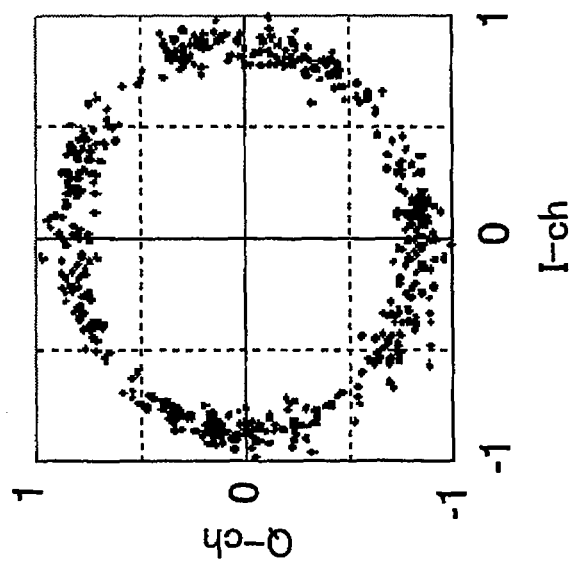
FIG. 6A is a diagram illustrating a signal constellation that is observed when phase tracking of a local oscillator light source has not been performed in the digital receiver of FIG. 4.

When there is a (relatively large) gap in optical frequency between the local oscillator light source 302 and a light source on the transmitter side, the constellation of a reception signal (input signal) received by the digital receiver rotates with time, for example, in the manner illustrated in FIG. 6A. The input signal in this case may have a level distribution in which signal levels are distributed uniformly without dense parts and sparse parts, instead of a normal distribution as the distribution shown in FIG. 5(b). The digital receiver 300 consequently cannot process the reception signal normally.

In this embodiment, the local oscillator light phase monitor 305 monitors the phase of local oscillator light, and the local oscillator light phase adjusting portion 306 tracks and stabilizes the phase (frequency) of the local oscillator light source 302. This prevents the constellation of the reception signal from rotating as illustrated in FIG. 6B. As a result, dense parts and sparse parts appear in the level distribution of the input signal, and the digital receiver 300 can process the reception signal normally.

The uniform signal level distribution described above may also be caused by polarization fluctuations of an optical input signal or the like. However, in this case, too, a signal level distribution with dense parts and sparse parts which the input signal is supposed to have can be created by, for example, providing a polarization monitor and tracking polarization.

While an example of implementing the level distribution/gradient estimating portion 307 and the waveform monitoring portion 308 in the digital signal processing portion 103 is described in this embodiment, the circuit configuration thereof can be designed and changed arbitrarily. For instance, each function to be realized by the digital signal processing portion 103 may be implemented separately as a circuit with the use of a field programmable gate array (FPGA) or an application specific integrated circuit (ASIC).

This embodiment deals with an example in which a waveform monitoring circuit that uses exclusive OR (XOR) and a histogram monitoring circuit that uses counters (accumulators) respectively corresponding to levels are used as the waveform monitoring portion 308. The waveform monitoring portion 308 may instead be an oscilloscope. The level distribution/gradient estimating portion 307 in this case may be a personal computer (PC) or the like.

Furthermore, while a case where an optical input signal has waveform distortion caused by wavelength dispersion of the transmission path is described in this embodiment, this invention is not limited thereto and is also applicable to waveform distortion due to polarization dispersion, multi-mode dispersion, and the like.

Figure 7:
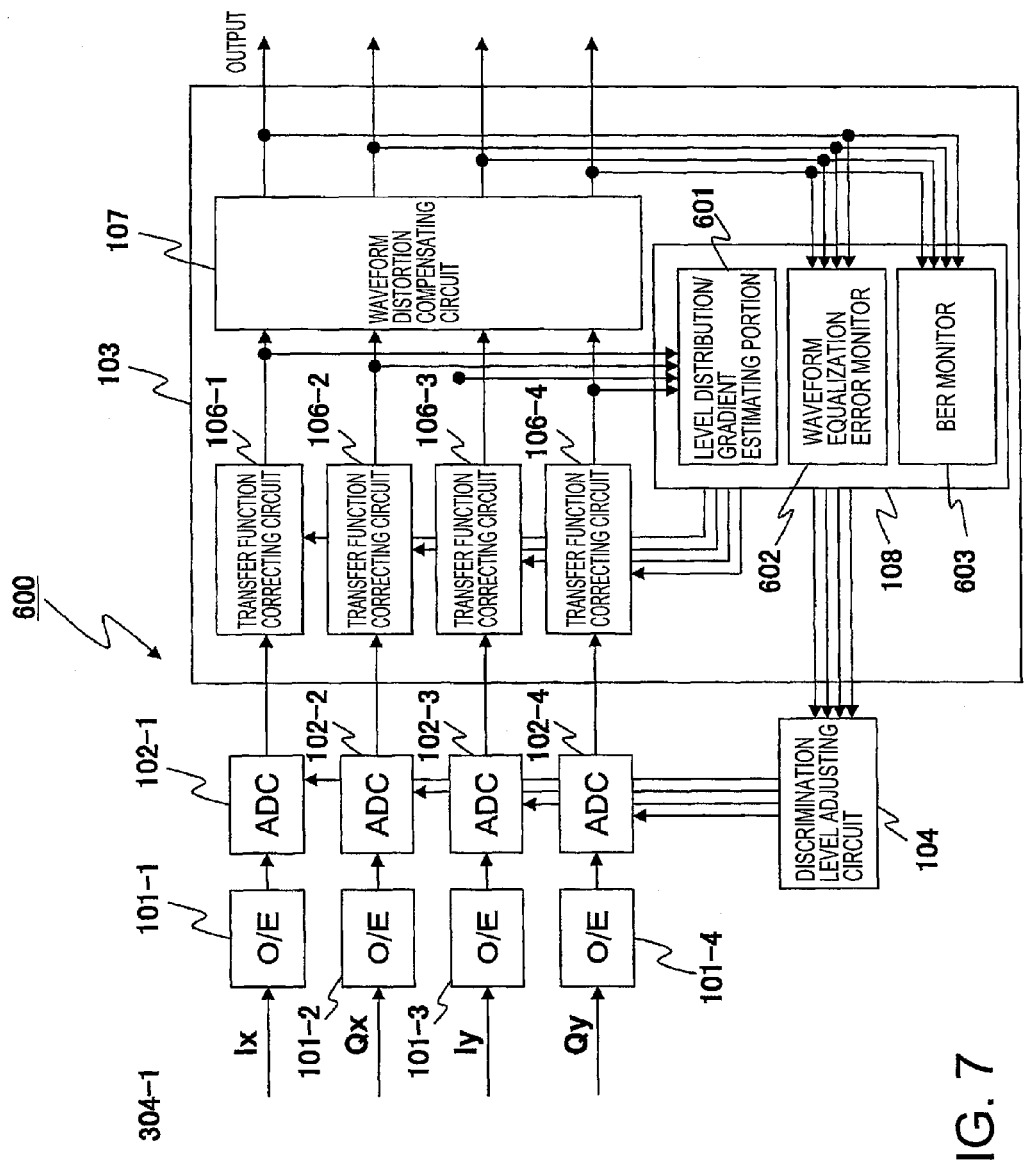
FIG. 7 is a block diagram illustrating the schematic configuration of a digital receiver according to a third embodiment of this invention.

A digital receiver according to a third embodiment of this invention is described next with reference to FIG. 7. In FIG. 7, components that are the same as those of the digital receiver of FIG. 4 are denoted by the same symbols in order to omit descriptions thereof.

The signal quality monitoring portion 108 of the digital receiver 600 illustrated in FIG. 7 includes a level distribution/gradient estimating portion 601, a waveform equalization error monitor 602, and a bit error rate (BER) monitor 603.

The level distribution/gradient estimating portion 601 doubles as the waveform monitoring portion 308 and level distribution/gradient estimating portion 307 of FIG. 4.

The waveform equalization error monitor 602 monitors a difference between the waveform of an output signal that is output from the waveform distortion compensating circuit 107 and an ideal waveform, namely, a waveform equalization error. The BER monitor 603 monitors the bit error rate of the output signal. The waveform equalization error monitor 602 and the BER monitor 603 both operate as signal quality monitors.

The level distribution/gradient estimating portion 601 obtains the histogram distribution f(x) or the absolute value g(x) of the gradient of f(x) as in the second embodiment. The level distribution/gradient estimating portion 601 corrects the obtained f(x) or g(x) based on monitoring results of the waveform equalization error monitor 602 and the BER monitor 603, and outputs the corrected f(x) or g(x) to the discrimination level adjusting circuit 104. The level distribution/gradient estimating portion 601 also generates transfer function correction control signals based on the corrected f(x) or g(x), and outputs the transfer function correction control signals to the transfer function correcting circuits 106-1 to 106-4.

Discrimination levels of the AD converters 102-1 to 102-4 are controlled more suitably in this embodiment by controlling the discrimination levels based not only on the result of monitoring the waveform but also on the result of monitoring waveform equalization errors and the bit error rate.

In this embodiment, where waveform equalization errors and bit error rates are monitored, the transfer function correcting circuits 106-1 to 106-4 can control signals so as to reduce waveform equalization errors or lower the bit error rate, instead of controlling so as to realize linear transfer characteristics. A digital receiver capable of highly precise demodulation can thus be configured.

A digital receiver according to a fourth embodiment of this invention is described next.

Figure 8:
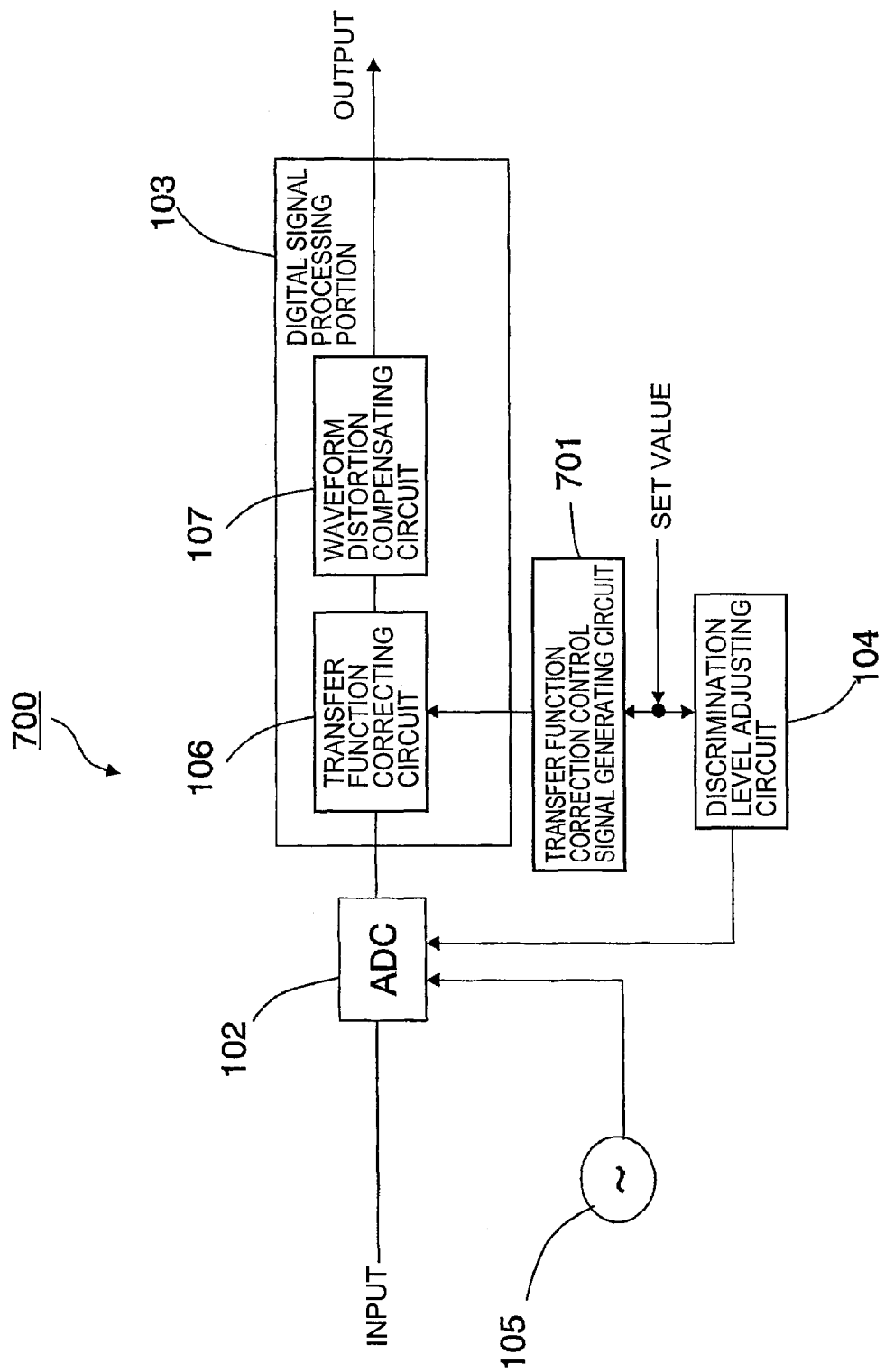
FIG. 8 is a block diagram illustrating the schematic configuration of a digital receiver according to a fourth embodiment of this invention.

FIG. 8 is a block diagram illustrating the schematic configuration of the digital receiver according to this embodiment. Components that are the same as those of the digital receiver of FIG. 1 are denoted by the same symbols in order to omit descriptions thereof.

The digital receiver 700 of FIG. 8 is devoid of the signal quality monitoring portion 108 used in the digital receiver of FIG. 1, and includes a transfer function correction control signal generating circuit 701 for generating a transfer function correction control signal. The transfer function correction control signal generating circuit 701 functions as the transfer function information generating means.

In the digital receiver according to the fourth embodiment of this invention, which is configured as described above, the discrimination level adjusting circuit 104 generates a discrimination level control signal for adjusting discrimination levels of the AD converter 102 optimally, based on a set value which is set in advance. The transfer function correction control signal generating circuit 701 generates the transfer function correction control signal in conjunction with the set value. Because the transfer function correction control signal is generated based on the set value which determines control discrimination levels, a favorable digital receiver with a simpler configuration is obtained without using complicated means such as a signal quality monitor.

The discrimination level control signal generated by the discrimination level adjusting circuit 104 is connected to a discrimination level adjustment terminal of the AD converter 102. The AD converter 102 can be a general type of AD converter such as a flash AD converter or a successive approximation register (SAR) AD converter. In the case of a flash AD converter, for example, the switching of a resistance value for setting the reference voltage of a comparator which performs AD conversion can be controlled with a discrimination level control signal. In the case of a pipeline AD converter or an SAR AD converter, discrimination levels can be controlled by using a discrimination level control signal to adjust the offset of a digital-to-analog conversion (DAC) value against which an input signal is compared in amplitude.

Figure 9:
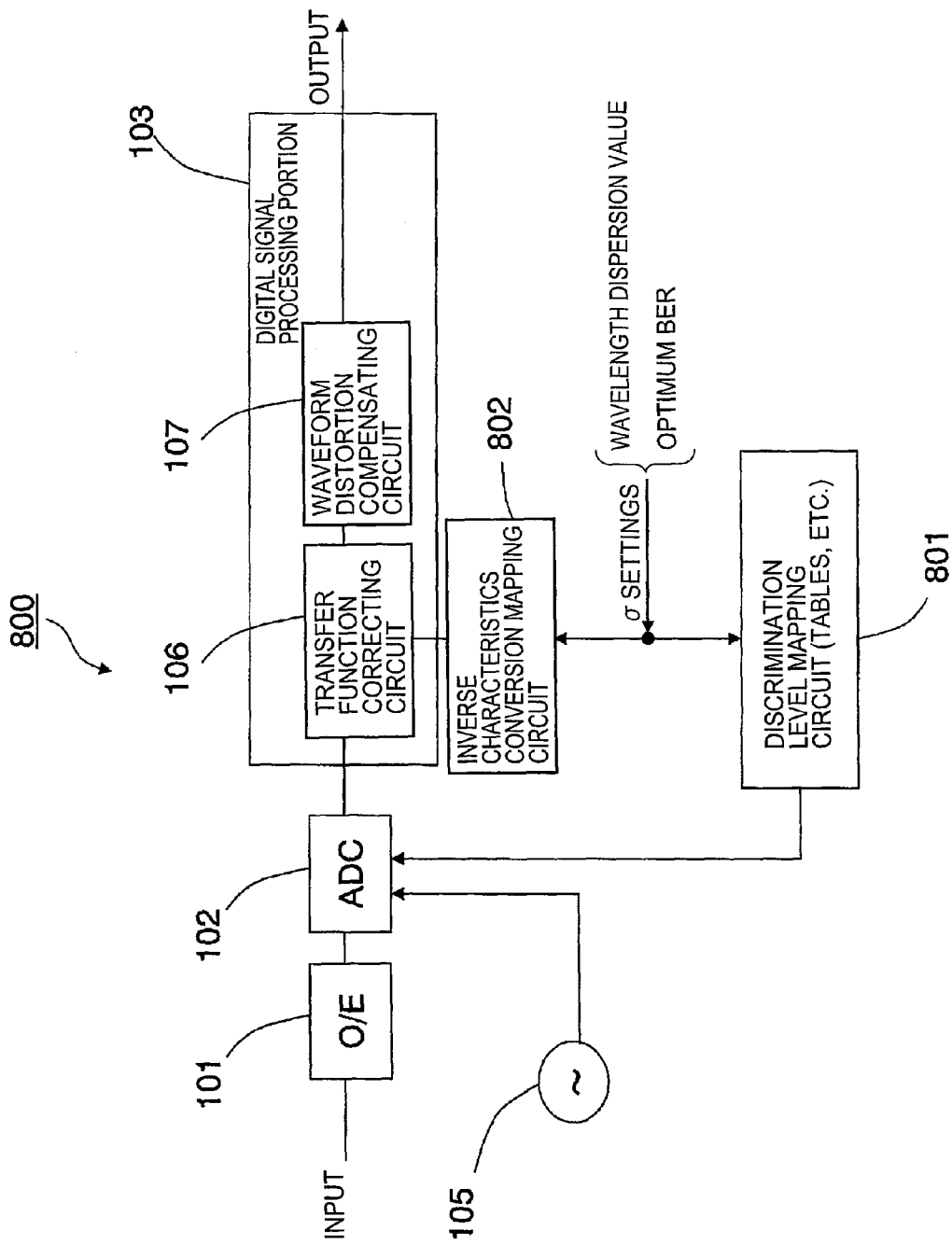
FIG. 9 is a block diagram illustrating a first modification example of the digital receiver according to the fourth embodiment of this invention.

FIG. 9 is a diagram illustrating a first modification example of the digital receiver according to the fourth embodiment of this invention. Components that are the same as those of the digital receiver of FIG. 8 are denoted by the same symbols in order to omit descriptions thereof.

The digital receiver 800 of FIG. 9 includes a discrimination level mapping circuit 801 as the discrimination level adjusting circuit 104, and includes an inverse characteristics conversion mapping circuit 802 as the transfer function correction control signal generating circuit 701. The discrimination level mapping circuit 801 is capable of discrimination level mapping in which discrimination levels are spaced unequally, unlike the linear discrimination level mapping of FIG. 19 in which discrimination levels are spaced equally.

The operation of the discrimination level mapping circuit 801 is described taking as an example the case where a reception waveform as the one shown in FIG. 10(a) is input to an input of the digital receiver 800 of FIG. 9.

FIG. 10(a) shows a waveform observed when a wavelength dispersion of 10,000 ps/nm is applied to a 100-Gbps DP-QPSK optical signal. FIG. 10(b) is a histogram graph about the amplitude distribution of the waveform of FIG. 10(a). The histogram (amplitude-frequency distribution) is shaped substantially like a Gaussian distribution, and the distribution pattern can be characterized with dispersion $\sigma$, which represents the breadth of a Gaussian distribution, as a parameter.

Figure 11:
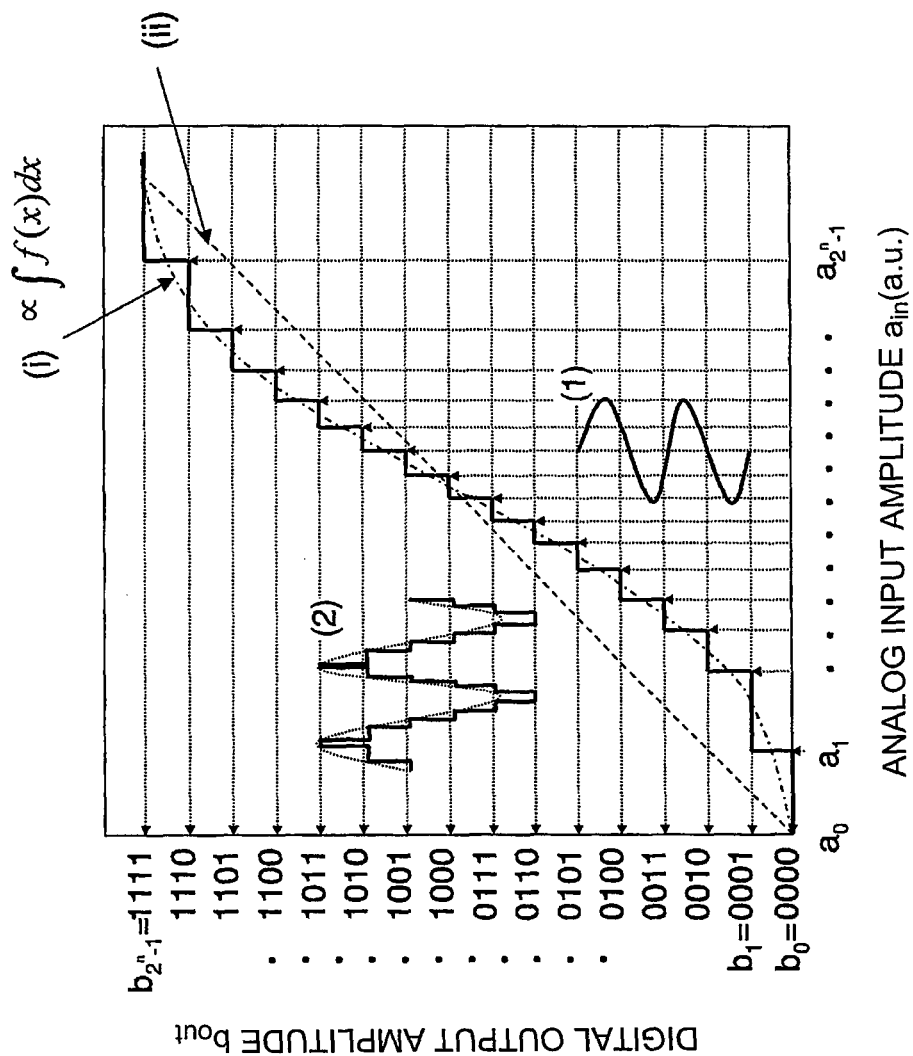
FIG. 11 is a diagram illustrating an example of discrimination level mapping for an AD converter of the digital receiver according to the fourth embodiment of this invention.

FIG. 11 shows an example of discrimination level mapping for setting discrimination levels of the AD converter 102 when the histogram of the input waveform described above is a Gaussian distribution.

FIG. 11 has an axis of abscissa which represents an analog input amplitude $a_{in}$, and an axis of ordinate which represents a digital output amplitude $b_{out}$, and shows an example in which the resolution of the AD converter 102 is 4 bits (n in the drawing=4). In the example of FIG. 11, the digital output $b_{out}$ is mapped onto $b_k$ (a digital value is expressed as a 4-bit binary number in the example of FIG. 11) when the analog input amplitude $a_{in}$ satisfies $a_k \leq a_{in} \leq a_{k+1}$.

A curve (i) represents a curve that is in proportion to a value expressed by the following Expression 1 when the Gaussian distribution pattern is expressed as $f(x)$ (x: input amplitude value $a_{in}$), and a straight line (ii) represents a straight line related to the conventional linear discrimination level mapping.

Figure 12:
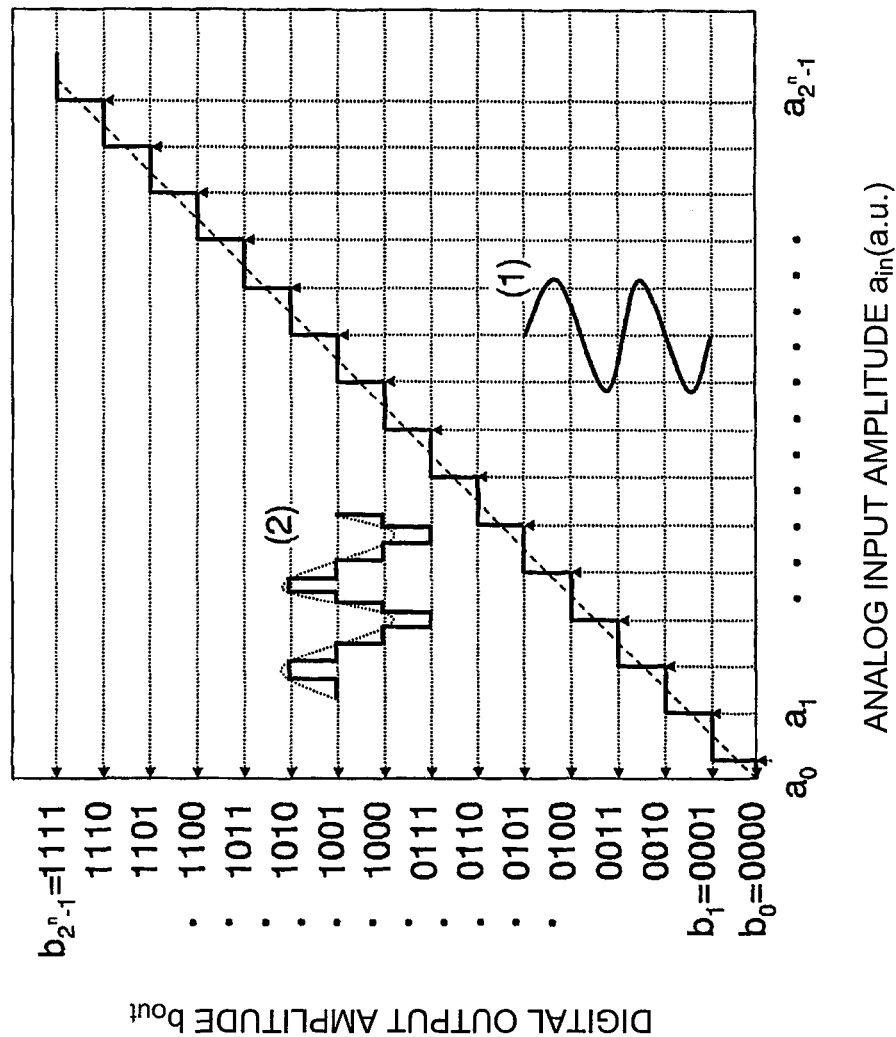
FIG. 12 is a diagram illustrating an example of discrimination level mapping for the case where ideal transfer characteristics that are demanded of an AD converter used in a digital coherent receiver are to be realized.

For comparison, FIG. 12 shows an example of the conventional linear discrimination level mapping in the form of the straight line (ii).

The graphs of FIG. 11 and FIG. 12 each show an analog waveform (1) and a digital waveform (2) as an example of the input waveform and the output waveform. In other words, these graphs show how the analog waveform (1) which is a sine wave is converted into the digital waveform (2) based on the discrimination level mapping in question.

$$\propto \int_{-FS/2}^{a_{in}} f(x)\, dx = \int_{-FS/2}^{a_{in}} \frac{1}{\sqrt{2\pi}\,\sigma} \exp\left(-\frac{(x-FS/2)^2}{2\sigma^2}\right) dx \quad \text{(Expression 1)}$$

In Expression 1, $\sigma$ represents the dispersion of the Gaussian distribution (normal distribution), and full-scale (FS) represents a value related to the maximum input amplitude of the AD converter 102.

The value of $a_k$ may be determined so that a value $f(a_k)$ of the curve (i) at $a_k$ takes an arbitrary value between $b_{k-1}$ and $b_k$, or may be determined by performing calibration, training, feedback control, or the like so as to give the digital receiver 800 the most favorable eye openings of the output waveform or the most favorable bit error rate.

FIG. 13A and FIG. 13B are diagrams illustrating quantization errors that are observed when the value of $a_k$ is determined as a value exactly in the middle between $b_{k-1}$ and $b_k$ as an example of how the value of $a_k$ is determined. FIG. 13A illustrates a quantization error that is observed when the conventional linear discrimination level mapping of FIG. 12 is used. FIG. 13B illustrates a quantization error that is observed when the discrimination level mapping of FIG. 11 which is performed by the digital receiver according to the fourth embodiment of this invention is used.

The quantization error of FIG. 13A is uniform at $\pm\frac{1}{2}$LSB (least significant bit=$\frac{1}{2}$n), irrespective of the input amplitude. The quantization error of FIG. 13B, on the other hand, is set to be small when the input level is around the center (which corresponds to a small-amplitude input in AC coupling) and to be large when the input level is near the ends (which corresponds to a large-amplitude input in AC coupling).

Figure 10:
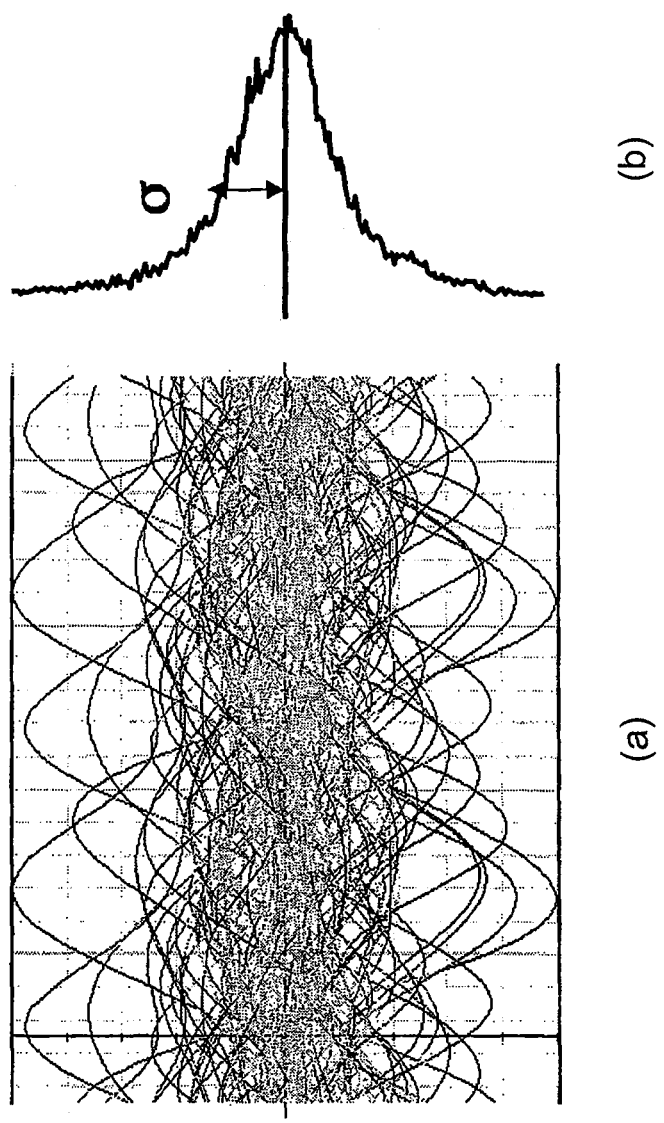

Therefore, when an input waveform whose amplitude-frequency distribution is shaped substantially like a Gaussian distribution as in FIG. 10 is input to a digital receiver on which the discrimination level mapping of FIG. 11 has been performed, the input waveform around the center where the amplitude-frequency distribution is highest undergoes AD conversion that is small in quantization error, and the input waveform near the ends where the frequency distribution is low undergoes AD conversion that is large in quantization error. As a result, quantization noise is practically smaller in a digital receiver on which the discrimination level mapping of FIG. 11 has been performed than in AD conversion that uses the discrimination level mapping of FIG. 12 which is performed by conventional digital receivers.

Figures 14A, 14B, 14C:
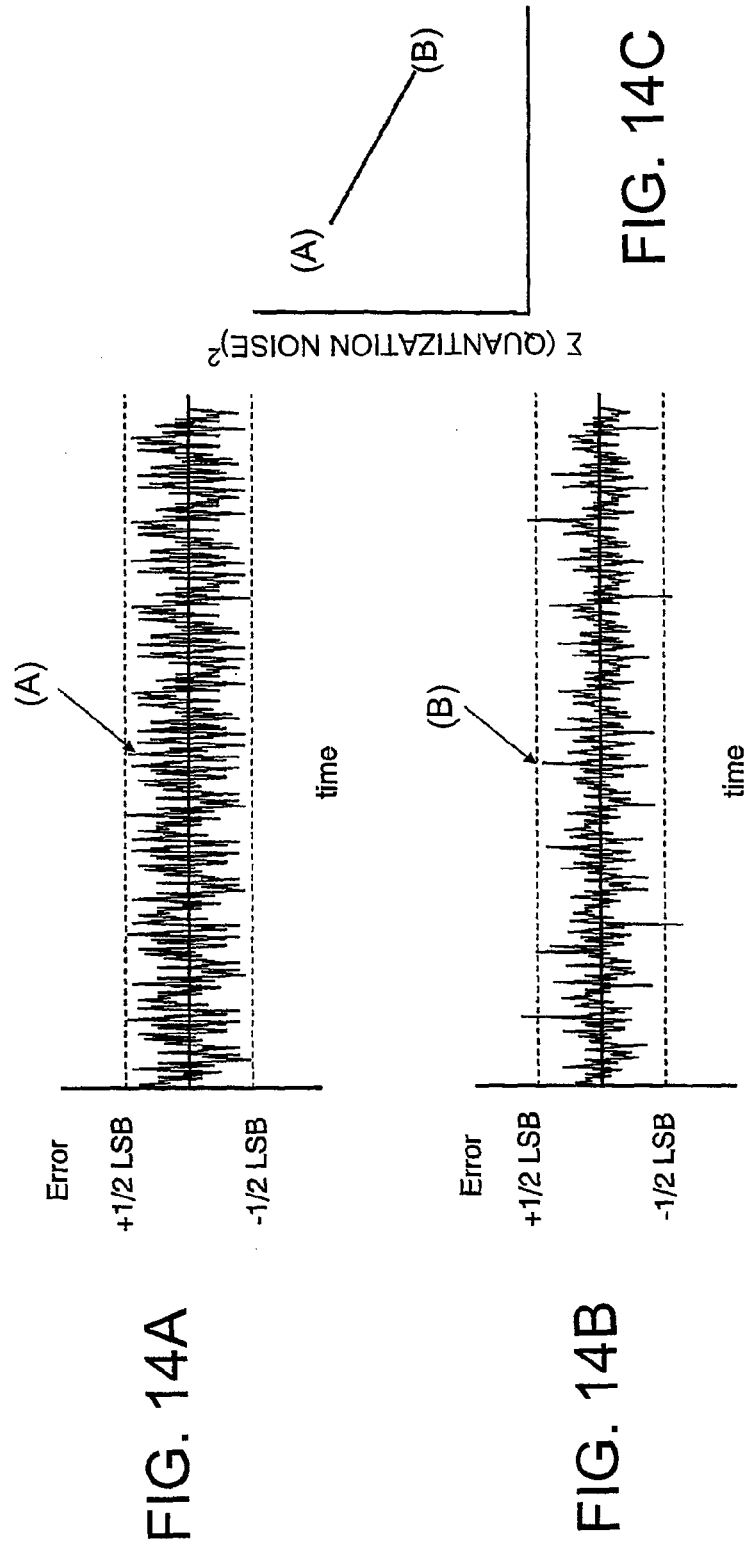
FIG. 14A is a graph showing changes with time of quantization error of the AD converter on which the discrimination level mapping of FIG. 12 has been performed.
FIG. 14B is a graph showing changes with time of quantization error of the AD converter on which the discrimination level mapping of FIG. 11 has been performed.
FIG. 14C is a graph showing a difference in mean power of the quantization error between FIG. 14A and FIG. 14B.

FIGS. 14A, 14B, and 14C are diagrams illustrating more concretely how the digital receiver according to this embodiment reduces quantization noise. FIG. 14A and FIG. 14B are diagrams illustrating images of quantization errors that occur when an input waveform whose amplitude-frequency distribution is high around the center and low near the ends is input and AD conversion is performed with the use of discrimination level mapping that causes the quantization errors of FIG. 13A and FIG. 13B.

FIG. 14A is an image diagram of AD conversion that uses the conventional discrimination level mapping of FIG. 12, and illustrates uniform quantization noise which occurs between +½LSB and −½LSB. FIG. 14B is an image diagram of AD conversion that uses the discrimination level mapping of FIG. 11 which is performed by the digital receiver according to the fourth embodiment of this invention. Compared to FIG. 14A, the result of FIG. 14B is more true to the amplitude-frequency distribution of the input. Specifically, in FIG. 14B, a quantization error whose absolute value is smaller than ±½LSB occurs frequently and the probability of the occurrence of a quantization error whose absolute value is larger than ±½LSB is low. FIG. 14C shows the relation between the square sum of quantization noise (A) of FIG. 14A and the square sum of quantization noise (B) of FIG. 14B. It is understood from these facts that the digital receiver according to this embodiment is improved in mean power of square quantization error (for example, root mean of the square sum).

In order to realize the discrimination level mapping described above, the discrimination level mapping circuit 801 stores in advance a plurality of mapping tables associated with a plurality of values of the dispersion σ. The discrimination level mapping circuit 801 selects the most appropriate mapping table based on the input value of the dispersion σ, and supplies information about the selected mapping table to the AD converter 102 as a discrimination level control signal. The function f(x) used in Expression 1 may be obtained by estimating the signal level distribution/gradient with the use of the level distribution/gradient estimating portion 307 of the second embodiment or the level distribution/gradient estimating portion 601 of the third embodiment.

Figure 15:
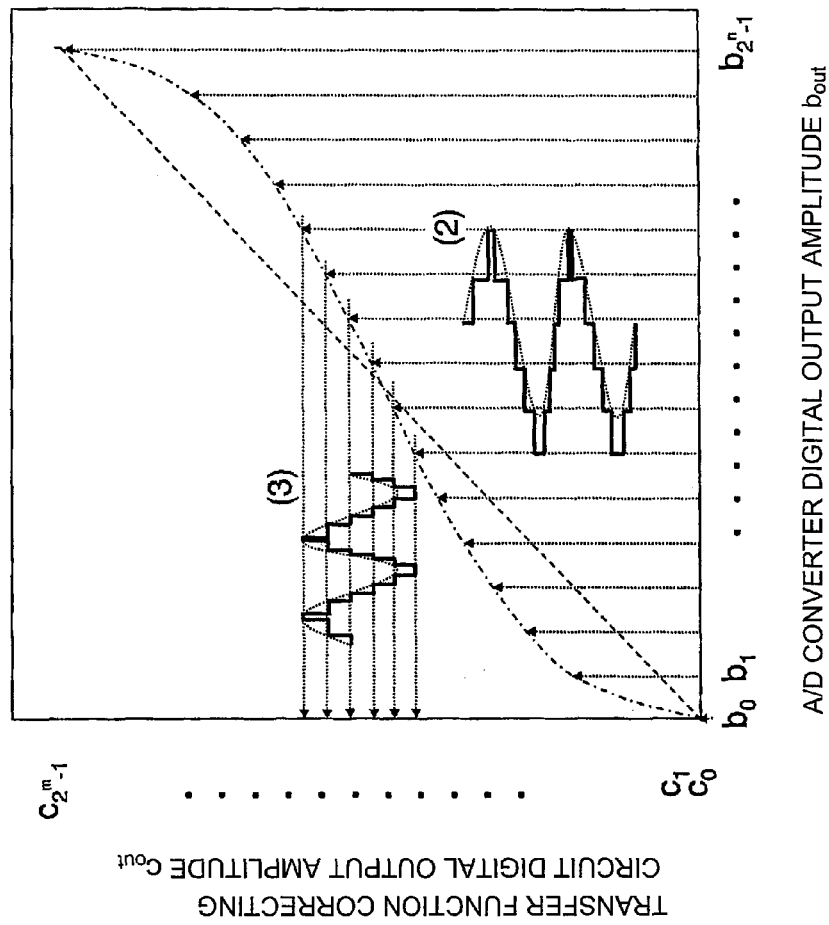
FIG. 15 is an explanatory diagram illustrating the principle of inverse characteristics conversion mapping of a transfer characteristics correcting circuit.

The inverse conversion mapping circuit 802 controls the transfer characteristics correcting circuit 106 so as to provide transfer characteristics that cancel a gap of the transfer function of the AD converter 102 from the initial transfer function, based on the input value of the dispersion σ. Specifically, as illustrated in FIG. 15, the digital output signal $b_{out}$ from the AD converter 102 is mapped onto a digital signal $c_{out}$ by inverse conversion mapping with the use of an inverse function of Expression 1. In this inverse conversion mapping, which is discrete mapping with digital signals, it is sufficient if a digital value of $c_{out}$ that is closest to an inverse function value of Expression 1 is mapped. In other words, a bit width m of $c_{out}$ does not always need to match a bit width n of $b_{out}$ (generally m≥n in order to avoid lowering the calculation precision), and can be determined as a trade-off between the bit precision of calculation and the circuit scale/power consumption. The graph of FIG. 15 shows digital waveforms (2) and (3) as an example of an input waveform and output waveform of the transfer characteristics correcting circuit 106. The digital waveform (2) is obtained by performing AD conversion on a sine wave. Under control of the inverse conversion mapping circuit 802, the transfer characteristics correcting circuit 106 performs signal processing on the digital waveform (2) so as to correct transfer characteristics, and outputs the result as the digital waveform (3).

In order to realize the inverse conversion mapping described above, the inverse conversion mapping circuit 802 stores in advance a plurality of mapping tables associated with a plurality of values of the dispersion σ. These mapping tables correspond to the mapping tables kept in the discrimination level mapping circuit 801 on a one-on-one basis. The inverse characteristics conversion mapping circuit 802 selects the most appropriate mapping table based on the input value of the distribution σ, and supplies information about the selected mapping table to the transfer function correcting circuit 106 as a transfer function correction control signal.

Figure 16:
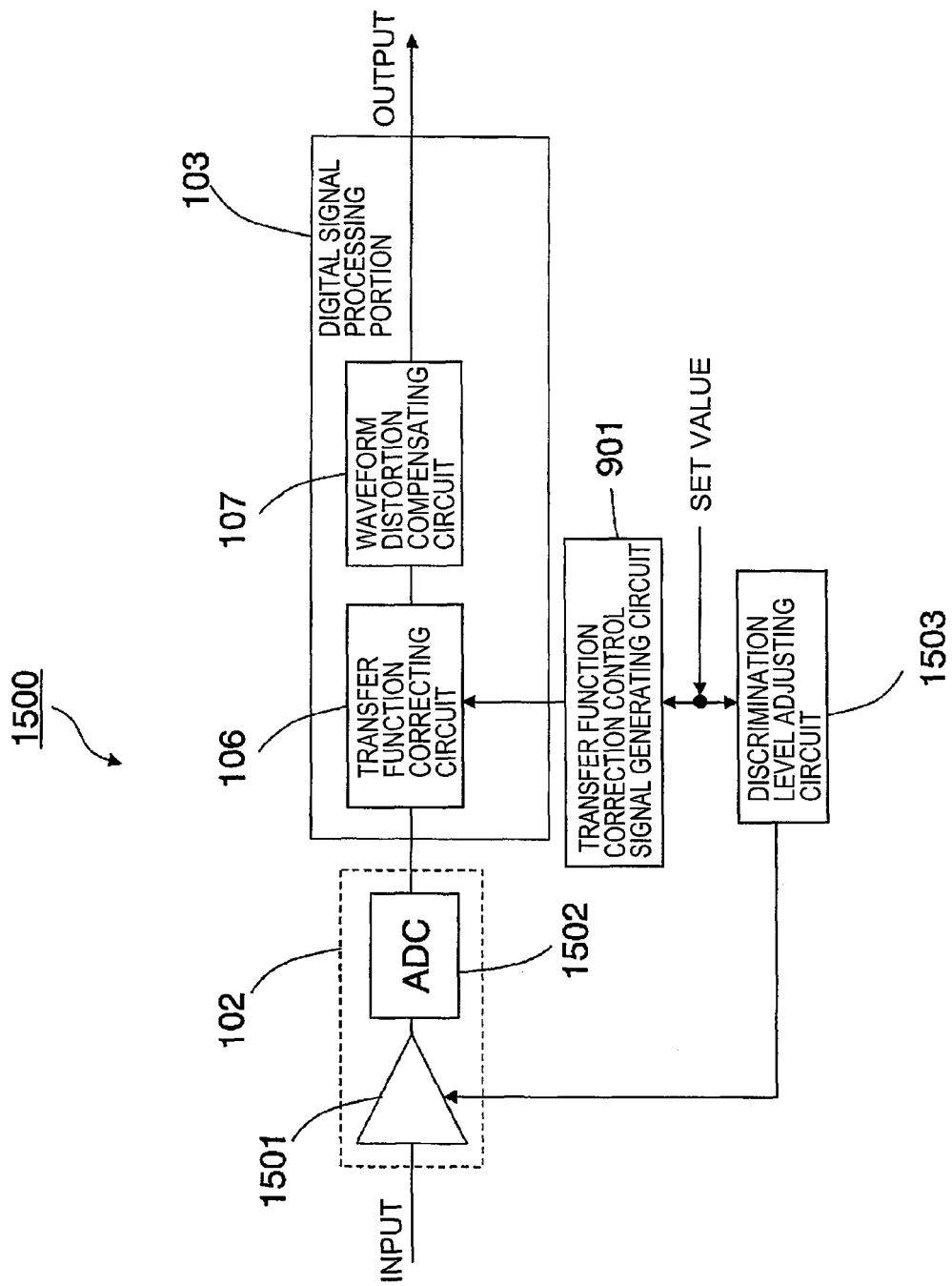
FIG. 16 is a block diagram illustrating a second modification example of the digital receiver according to the fourth embodiment of this invention.

FIG. 16 is a diagram illustrating a second modification example of the digital receiver according to the fourth embodiment of this invention. Components that are the same as those of the digital receiver of FIG. 8 are denoted by the same symbols in order to omit descriptions thereof.

The digital receiver 1500 of FIG. 16 includes transfer characteristics adjusting circuit 1501, a linear AD converter 1502, and a discrimination level adjusting circuit 1503. The transfer characteristics adjusting circuit 1501 and the linear AD converter 1502 constitute the AD conversion circuit 102. The linear AD converter 1502 is a linear AD converter that is used in conventional digital receivers. The transfer characteristics adjusting circuit 1501 can be, for example, a limiting amplifier. The transfer characteristics adjusting circuit 1501 makes it possible to adjust the limiting level/gain that is used when an input signal is amplified based on a discrimination level adjusting signal, which is generated in the discrimination level adjusting circuit 1503. The combination of the transfer characteristics adjusting circuit 1501 and the linear AD converter 1502 can therefore equivalently generate non-linear transfer characteristics that correspond to the curve (i) of FIG. 11 described above. Specifically, the linear AD converter 1502 placed in the downstream of the transfer characteristics adjusting circuit 1501 performs the conventional linear AD conversion, and a signal having the digital output amplitude $b_{out}$ of FIG. 11 is consequently output from the AD converter 102. The signal having the digital output amplitude $b_{out}$ is processed by the transfer characteristics correcting circuit 106 through signal processing so as to cancel out the non-linear characteristics brought about by the transfer characteristics adjusting circuit 1501. The processed signal is then output. The subsequent digital signal processing is the same as in the other digital receivers of this invention, and a description thereof is omitted.

The transfer characteristics adjusting circuit 1501 can be, other than a limiting amplifier, various circuits that adjust discrimination levels equivalently, such as a log amplifier.

As has been described, in the digital receiver according to the fourth embodiment of this invention, the effective resolution (ENOB: effective number of bits) of the AD converter 102 can be improved to a degree that exceeds the physical resolution of the AD converter 102, and the reception precision is accordingly improved.

The description given above deals with the case where the AD converter 102 operates ideally as an AD converter (only quantization noise exists with no influence of thermal noise and no calibration errors). However, it is obvious from the operation principle thereof that the same effect can be obtained also when other types of noise than quantization noise are present.

The example of the DP-QPSK optical signal in FIGS. 10(a) and 10(b) is not a special exception and, in digital receivers in general that employ differential reception, a histogram of the amplitude distribution has the Gaussian distribution pattern of FIG. 10(b) due to wavelength dispersion and the influence of optical noise, which means that the distribution pattern can be characterized by using the dispersion σ which represents the breadth of a Gaussian distribution as a parameter. Therefore, mapping tables can be switched by selecting and setting σ in accordance with a wavelength dispersion compensating value or an optical signal-to-noise ratio (OSNR) that is measured or estimated in advance. It is also possible to set σ so as to yield a favorable system performance quality in terms of eye openings, bit error rate, or the like.

Figure 17:
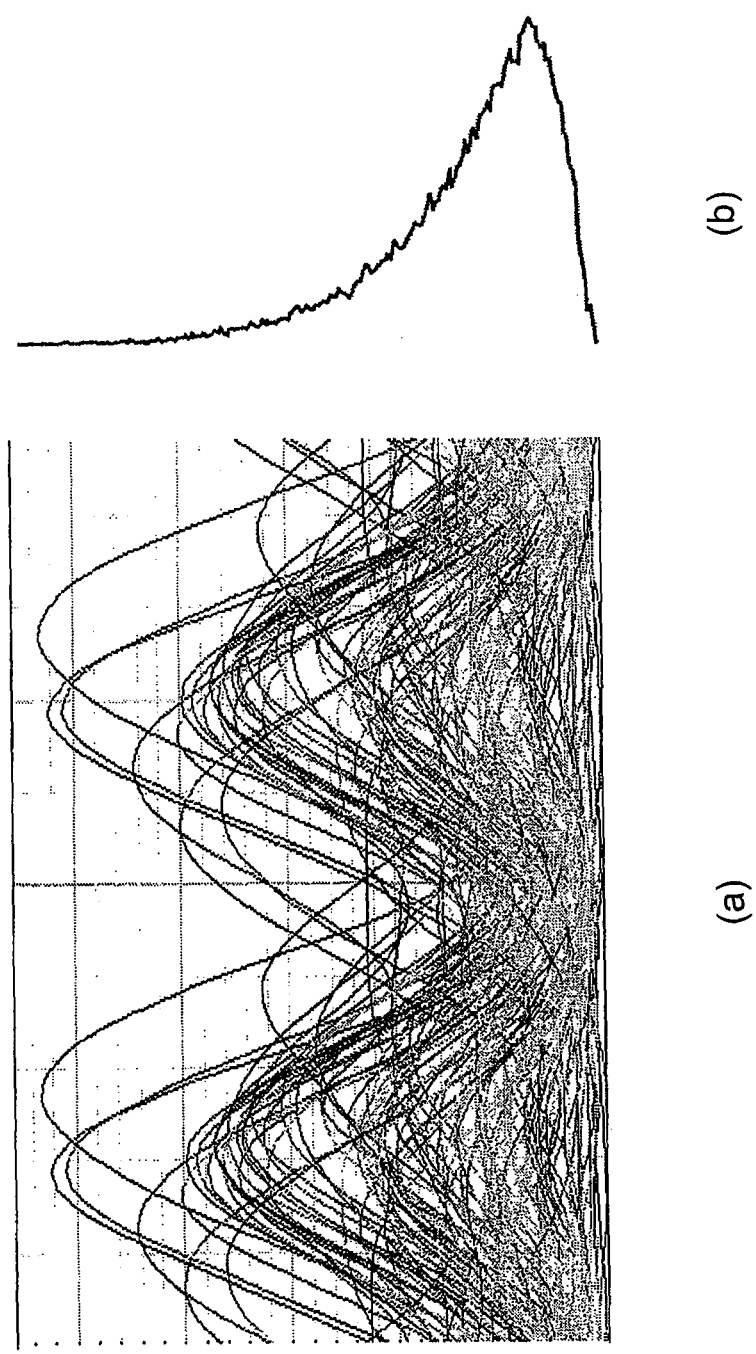
Figure 18:
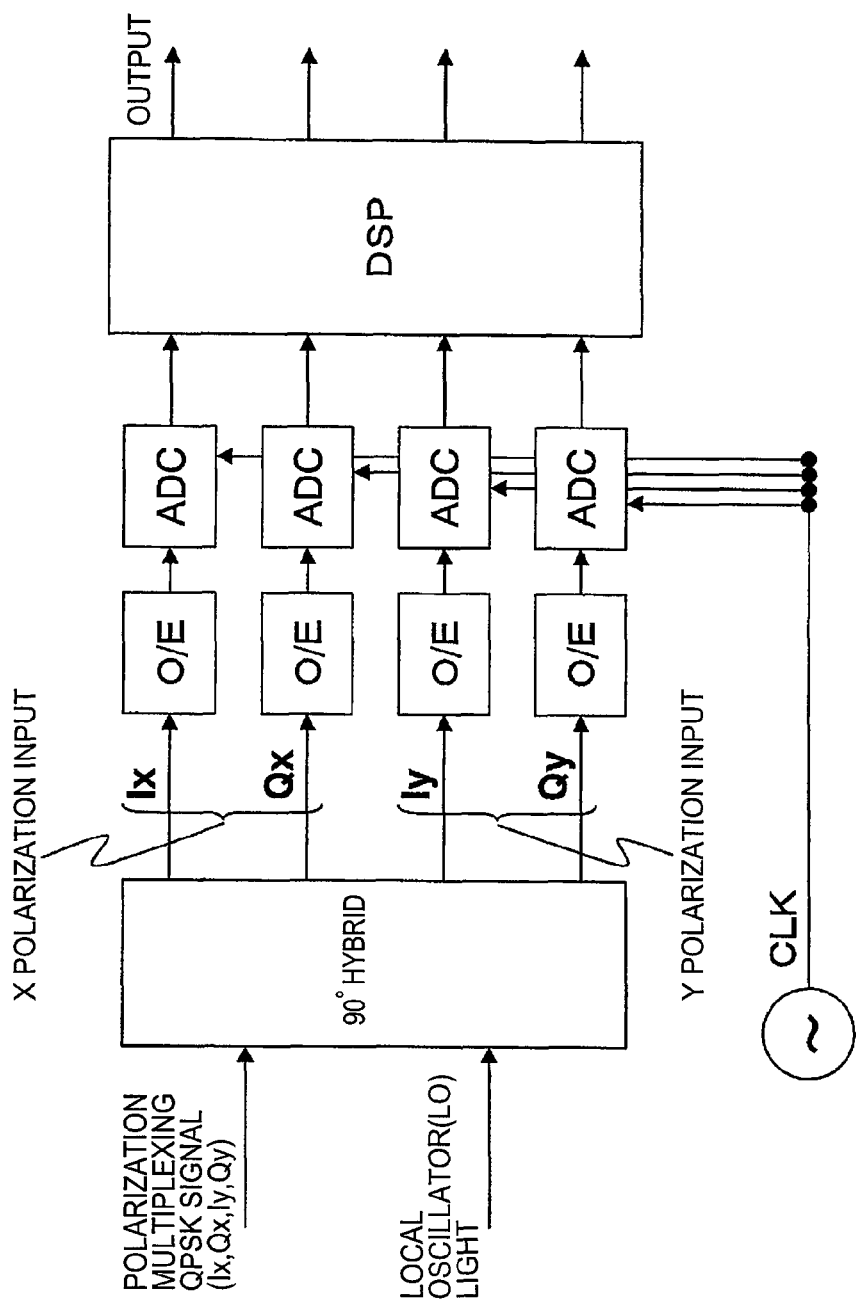
FIG. 18 is a block diagram illustrating the schematic configuration of a related digital coherent receiver.

In the case of On-Off Keying (OOK) modulation signals and digital receivers that do not employ differential reception, the amplitude-frequency distribution of an input signal cannot be characterized by the Gaussian distribution. For instance, a waveform obtained by applying a wavelength dispersion of 40,000 ps/nm to a carrier-suppressed return-to-zero (CS-RZ) waveform is as shown in a waveform diagram of FIG. 17(a), and has an amplitude-frequency distribution of FIG. 17(b). However, in such cases, too, the discrimination level mapping using Expression 1 can be executed by setting the frequency distribution pattern of FIG. 17(b), instead of the Gaussian distribution, as f(x). In other words, for an input waveform that has an amplitude-frequency distribution pattern in which the signal amplitude has frequency distribution differences, the discrimination level mapping using Expression 1 and the inverse characteristics conversion mapping can generally be executed by setting this frequency distribution pattern as f(x), and the effective resolution of the AD converter 102 is accordingly improved as in the example of FIG. 14.

For Orthogonal Frequency-Division Multiplexing (OFDM) and other modulation methods that are high in peak-to-average power ratio (PAPR) or a signal required to have a wide amplitude dynamic range, using a log function as f(x) of Expression 1 expands the effective input amplitude range and results in favorable reception performance.

The discrimination level mapping using Expression 1 does not always need to be executed, and the discrimination level mapping circuit 801 and the inverse conversion mapping circuit 802 may be set so as to yield favorable system performance. For example, while FIG. 2(d) or FIG. 3(d) shows discrimination level setting equivalent to Expression 1 described above (discrimination level mapping in which discrimination levels are spaced in proportion to the inverse number of the level-frequency distribution), opposite discrimination mapping in which finer discrimination is made around the center of the amplitude (a domain where the level-frequency distribution is small) may be used in order to accomplish finer digital signal processing around a discrimination level at which determination between "0" and "1" is performed. Alternatively, discrimination levels may be mapped more densely in a domain where the f(x) gradient is sharpest in order to perform digital signal processing on a signal that changes rapidly. In short, the discrimination level mapping circuit 801 and the inverse conversion mapping circuit 802 can be configured so that settings suitable for the digital signal processing method used in the downstream are always selected.

This invention has now been described through some embodiments but is not limited to the embodiments described above, and various modifications/changes can be made to this invention. For instance, while the embodiments described above deal with the case where the input signal is an optical signal, this invention is applicable to various receivers for receiving signals that have waveform distortion due to various types of dispersion (phasing) in a transmission path, such as a radio signal.

Further, while the embodiments described above take a DP-QPSK signal as an example of the input signal, this invention is applicable to signals of various modulation methods such as an Amplitude Shift Keying (ASK) signal, a Binary PSK (BPSK) signal, a Single Polarization (SP)-QPSK signal, and an Orthogonal Fourier Division Multiplexing (OFDM).

A part of or the entirety of the embodiments described above can also be described as in the following notes but is not limited thereto.

[Supplementary Notes]

(Supplementary Note 1)

A digital receiver, including: analog-to-digital conversion means for setting discrimination levels in accordance with a discrimination level control signal, converting an analog input signal into a digital signal based on the set discrimination levels, and outputting the digital signal; discrimination level adjusting means for generating the discrimination level control signal and outputting the discrimination level control signal to the analog-to-digital conversion means; transfer function information generating means for generating information about a transfer function of the analog-to-digital conversion means which is dependent on the discrimination levels; and transfer function correcting means for performing signal processing on the digital signal so as to cancel a gap between the transfer function of the analog-to-digital conversion means and an initial transfer function, which is set in advance, based on the information about the transfer function.

(Supplementary Note 2)

A digital receiver of Supplementary Note 1, in which the transfer function information generating means is signal quality monitoring means for monitoring a quality of the digital signal which has undergone the signal processing by the transfer function correcting means to generate a monitoring result, and generating a transfer function correction control signal as the information about the transfer function based on the monitoring result, and the discrimination level adjusting means generates the discrimination level control signal based on the monitoring result.

(Supplementary Note 3)

A digital receiver of Supplementary Note 1 or 2, in which the discrimination levels are set so as to be spaced unequally.

(Supplementary Note 4)

A digital receiver of any one of Supplementary Notes 1, 2, and 3, in which the analog-to-digital conversion means includes a plurality of analog-to-digital converters which correspond to signal channels, and sets the discrimination levels for each of the plurality of analog-to-digital converters separately.

(Supplementary Note 5)

A digital receiver of Supplementary Note 2, in which the signal quality monitoring means includes waveform monitoring means and signal level distribution/gradient estimating means.

(Supplementary Note 6)

A digital receiver of Supplementary Note 2, in which the signal quality monitoring means includes wavelength equalization error monitoring means.

(Supplementary Note 7)

A digital receiver of Supplementary Note 2, in which the signal quality monitoring means includes bit error rate monitoring means.

(Supplementary Note 8)

A digital receiver of any one of Supplementary Notes 1 to 7, in which the analog input signal is an analog electrical signal obtained by optical-to-electrical conversion of an optical input signal.

(Supplementary Note 9)

A digital receiver of Supplementary Note 8, in which the optical input signal has been modulated by a phase shift keying modulation method.

(Supplementary Note 10)

A digital receiver of Supplementary Note 1, in which the discrimination level adjusting means generates the discrimination level control signal based on a set value, and the transfer function information generating means generates the transfer function information based on the set value.

(Supplementary Note 11)

A digital receiver of Supplementary Note 10, in which the discrimination level control signal and the transfer function information are each generated based on a mapping table which is prepared in advance to show a relation with the set value.

(Supplementary Note 12)

A digital receiver of Supplementary Note 10 or 11, in which the mapping table is calculated based on a frequency distribution of an amplitude level of the analog input signal.

(Supplementary Note 13)

A digital receiver of any one of Supplementary Notes 10 to 12, in which the discrimination level adjusting means maps input/output levels based on an estimation of a signal level distribution/gradient which is substantially patterned after a Gaussian distribution.

(Supplementary Note 14)

A digital receiver of any one of Supplementary Notes 1 to 13, further including waveform distortion compensating means for compensating waveform distortion of the digital signal which has undergone the signal processing by the transfer function correcting means.

(Supplementary Note 15)

An optical communication system including the digital receiver of any one of Supplementary Notes 1 to 14.

The invention claimed is:

1. A digital receiver, comprising:
   an analog-to-digital conversion portion setting discrimination levels in accordance with a discrimination level control signal, converting an analog input signal into a digital signal based on the set discrimination levels, and outputting the digital signal;
   a discrimination level adjusting portion generating the discrimination level control signal and outputting the discrimination level control signal to the analog-to-digital conversion portion;
   a transfer function information portion for generating information about a transfer function of the analog-to-digital conversion portion which is dependent on the discrimination levels; and
   a transfer function correcting portion performing signal processing on the digital signal so as to cancel a gap between the transfer function of the analog-to-digital conversion portion and an initial transfer function, which is set in advance, based on the information about the transfer function.

2. A digital receiver according to claim 1,
   wherein the transfer function information generating portion comprises a signal quality monitoring portion monitoring a quality of the digital signal which has undergone the signal processing by the transfer function correcting portion to generate a monitoring result, and generating a transfer function correction control signal as the information about the transfer function based on the monitoring result, and
   wherein the discrimination level adjusting portion generates the discrimination level control signal based on the monitoring result.

3. A digital receiver according to claim 1, wherein the discrimination levels are set so as to be spaced unequally.

4. A digital receiver according to claim 1, wherein the analog-to-digital conversion portion comprises a plurality of analog-to-digital converters which correspond to signal channels, and sets the discrimination levels for each of the plurality of analog-to-digital converters separately.

5. A digital receiver according to claim 1, wherein the discrimination level adjusting portion generates the discrimination level control signal based on a set value, and the transfer function information generating portion generates the transfer function information based on the set value.

6. A digital receiver according to claim 5, wherein the discrimination level control signal and the transfer function information are each generated based on a mapping table which is prepared in advance to show a relation with the set value.

7. A digital receiver according to claim 6, wherein the mapping table is calculated based on a frequency distribution of an amplitude level of the analog input signal.

8. A digital receiver according to claim 5, wherein the discrimination level adjusting portion maps input/output levels based on an estimation of a signal level distribution/gradient which is substantially patterned after a Gaussian distribution.

9. A digital receiver according to claim 1, further comprising a waveform distortion compensating portion compensating waveform distortion of the digital signal which has undergone the signal processing by the transfer function correcting portion.

10. An optical communication system, comprising the digital receiver of any one of claims 1 to 9.

11. A digital receiver according to claim 1, wherein the discrimination levels of the discrimination level adjusting portion generates the discrimination level control signal based on a frequency distribution of an amplitude level of the analog input signal.

* * * * *

UNITED STATES PATENT AND TRADEMARK OFFICE
CERTIFICATE OF CORRECTION

PATENT NO. : 8,681,027 B2
APPLICATION NO. : 13/521917
DATED : March 25, 2014
INVENTOR(S) : Junichi Abe and Hidemi Noguchi It is certified that error appears in the above-identified patent and that said Letters Patent is hereby corrected as shown below:

In the Specification

Column 1, Line 40: Delete "Ty," and insert -- Iy, --

Column 7, Line 19: Delete "minor" and insert -- mirror --

Column 8, Line 26: Delete "Ty," and insert -- Iy, --

Column 8, Line 28: Delete "Ty," and insert -- Iy, --

Column 8, Line 32: Delete "Ty," and insert -- Iy, --

Signed and Sealed this
Twenty-first Day of October, 2014

Michelle K. Lee
*Deputy Director of the United States Patent and Trademark Office*